US010796659B2

(12) United States Patent
Tagawa et al.

(10) Patent No.: US 10,796,659 B2
(45) Date of Patent: Oct. 6, 2020

(54) DISPLAY DEVICE AND METHOD FOR DRIVING THE SAME

(71) Applicant: Sharp Kabushiki Kaisha, Sakai, Osaka (JP)

(72) Inventors: Akira Tagawa, Sakai (JP); Yasuaki Iwase, Sakai (JP); Takuya Watanabe, Sakai (JP); Takatsugu Kusumi, Sakai (JP); Yohei Takeuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/390,033

(22) Filed: Apr. 22, 2019

(65) Prior Publication Data

US 2019/0325838 A1   Oct. 24, 2019

(30) Foreign Application Priority Data

Apr. 24, 2018   (JP) ................. 2018-082768

(51) Int. Cl.
*G09G 3/36* (2006.01)
*G11C 19/28* (2006.01)

(52) U.S. Cl.
CPC ......... *G09G 3/3696* (2013.01); *G09G 3/3677* (2013.01); *G09G 2310/0286* (2013.01); *G09G 2320/0233* (2013.01); *G11C 19/28* (2013.01)

(58) Field of Classification Search
CPC .................................................. G09G 3/3696
See application file for complete search history.

(56) References Cited

U.S. PATENT DOCUMENTS

| 2012/0076256 | A1 | 3/2012 | Yonemaru et al. |
| 2012/0098804 | A1 | 4/2012 | Ohhashi |
| 2012/0320008 | A1 | 12/2012 | Takahashi et al. |
| 2012/0327057 | A1* | 12/2012 | Sakamoto ............ G11C 19/28 345/211 |
| 2013/0069930 | A1 | 3/2013 | Fukaya et al. |
| 2014/0111495 | A1* | 4/2014 | Iwase ................... G09G 3/3677 345/211 |
| 2018/0033392 | A1* | 2/2018 | Xie ....................... G09G 3/3677 |

FOREIGN PATENT DOCUMENTS

| JP | 2010-86640 A | 4/2010 |
| WO | 2010/146738 A1 | 12/2010 |
| WO | 2010/150574 A1 | 12/2010 |

* cited by examiner

*Primary Examiner* — Hang Lin
(74) *Attorney, Agent, or Firm* — Keating & Bennett, LLP

(57) ABSTRACT

There is adopted a gate driver with a system of applying a direct current voltage as an active scanning signal to a gate bus line through a buffer transistor in a unit circuit that composes a shift register, and a display device is provided with a direct current voltage generation circuit that generates the direct current voltage. The direct current voltage generation circuit changes a voltage level of the direct current voltage in each frame period. For example, when a direct current voltage input terminal is provided on a vertical scanning end side, the direct current voltage generation circuit gradually decreases the voltage level of the direct current voltage in each frame period.

12 Claims, 32 Drawing Sheets

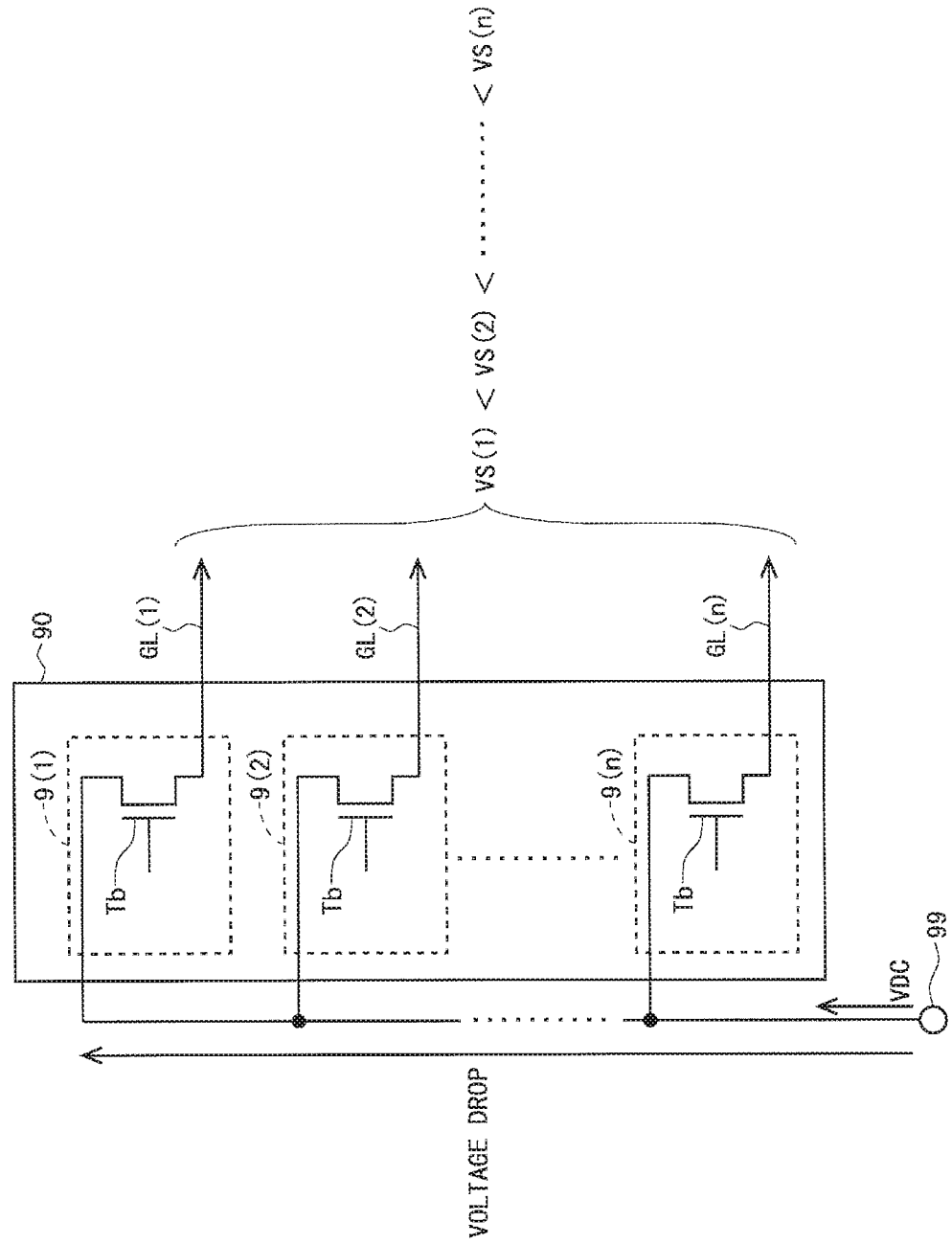

DISPLAY DEVICE AND METHOD FOR DRIVING THE SAME

BACKGROUND OF THE INVENTION

1. Field of the Invention

The following disclosure relates to a display device including a monolithic gate driver with a system in which a direct current voltage is applied as an active scanning signal to a gate bus line (scanning signal line) via a transistor in a shift register, and to a method for driving the display device.

2. Description of Related Art

Heretofore, there has been known an active matrix type liquid crystal display device provided with a display unit including a plurality of source bus lines (video signal lines) and a plurality of gate bus lines. With regard to such a liquid crystal display device, heretofore, in many cases, a gate driver (scanning signal line drive circuit) for driving the gate bus lines has been mounted as an integrated circuit (IC) chip on a peripheral portion of a substrate that constitutes a liquid crystal panel. However, in recent years, in order to narrow a frame of the liquid crystal display device, it has been gradually often that the gate driver is directly formed on an array substrate that is one substrate of two glass substrates which constitute the liquid crystal panel. Such a gate driver is called a "monolithic gate driver".

On the display unit of the active matrix type liquid crystal display device, there are formed a plurality of pixel formation portions provided to correspond to intersections of the plurality of source bus lines and the plurality of gate bus lines. The plurality of pixel formation portions are arranged in a matrix to constitute a pixel array. Each pixel formation portion includes a thin film transistor which is a switching element connected at its gate terminal to a gate bus line passing through a corresponding intersection and connected at its source terminal to a source bus line passing through the intersection, a pixel capacitance for holding a pixel voltage value, and the like.

A video signal indicating the pixel voltage value is transmitted by the source bus line. However, each source bus line cannot transmit the video signal indicating the pixel voltage values for a plurality of rows at one time (simultaneously). Therefore, writing (charge) of the video signal to the pixel capacitances in the above-mentioned pixel formation portions arranged in a matrix is sequentially performed one row by one row. Accordingly, the gate driver is composed of a shift register made of a plurality of stages so that the plurality of gate bus lines are sequentially selected every predetermined period. Then, active scanning signals are sequentially outputted from the respective stages of the shift register, whereby the writing of the video signals to the pixel capacitances is sequentially performed one row by one row as mentioned above. Note that, in this specification, a circuit which composes each of the stages of the shift register will be referred to as "unit circuit". Moreover, among transistors (typically TFTs) in the unit circuit, a transistor for controlling output of the active scanning signal to the gate bus line depending on a potential of the gate terminal will be referred to as "buffer transistor".

In the monolithic gate driver, in general, a high level voltage of a clock signal is applied as the active scanning signal to the gate bus line through the buffer transistor in the unit circuit which constitutes the shift register. However, as a size and definition of the panel are being increased, a power consumption by an operation of the shift register is increased. Accordingly, from a viewpoint of reducing the power consumption, there is proposed a system of applying a direct current voltage as the active scanning signal to the gate bus line through the buffer transistor in the unit circuit which constitutes the shift register. Hereinafter, for convenience, this system will be referred to as a "DC method". A liquid crystal display device that adopts such a DC method is described, for example, in International Publication WO 2010/146738, Japanese Laid-Open Patent Publication No. 2010-86640, and International Publication WO 2010/150574.

However, in a recent high-definition large panel, in comparison with the conventional case, a load of the gate bus lines is significantly increased, and a length of one horizontal scanning period is significantly shortened. Therefore, charging currents when the gate bus lines are charged with the direct current voltage through the buffer transistors are increased. Moreover, while the direct current voltage is supplied from an input terminal (hereinafter, referred to as "direct current voltage input terminal") on the panel through a predetermined wiring to each stage (each unit circuit) of the shift register, wiring resistance is larger as the panel is larger. From the above, particularly in the large panel, as illustrated in FIG. 34, a large voltage drop of a direct current voltage VDC occurs due to a large magnitude of the wiring resistance, and a voltage actually applied to the gate bus line as the active scanning signal (hereinafter, the voltage will be referred to as "scanning voltage") is smaller in the gate bus line which is located more distant from a direct current voltage input terminal 99. Note that, in FIG. 34, a gate driver is denoted by reference numeral 90, 1st to n-th-stage unit circuits of a shift register in the gate driver are denoted by reference numerals 9(1) to 9(n), buffer transistors are denoted by reference symbol Tb, 1st to n-th-row gate bus lines are denoted by reference symbols GL(1) to GL(n), and scanning voltages respectively applied to the 1st to n-th-row gate bus lines are denoted by reference symbols VS(1) to VS(n).

As described above, in a case where the DC system is adopted in the high-definition large panel, a magnitude of the scanning voltage of the gate bus line located near the direct current voltage input terminal is different from that of the gate bus line located far from the direct current voltage input terminal. More specifically, the magnitude of the scanning voltage differs for each gate bus line. Therefore, charging rate in the pixel formation portion differs for each row, and unevenness in display is brought about. Note that, in any of the above-mentioned documents of the related art, no description is given of the decrease of the scanning voltages, which is caused by wiring resistance in a wiring section for the direct current voltage and of unevenness in display, which is based on the decrease of the scanning voltages.

SUMMARY OF THE INVENTION

Accordingly, it is an object of the following disclosure to achieve a display device including a low-power-consumption gate driver capable of suppressing the occurrence of the unevenness in display.

A display device according to some embodiments includes:

a display panel including: a plurality of scanning signal lines each being connected to a plurality of pixel formation portions; and a scanning signal line drive circuit configured to perform vertical scanning by sequentially turning the plurality of scanning signal lines to a selected state in each frame period; and a direct current voltage generation circuit configured to generate a direct current voltage for turning the scanning signal lines to the selected state, wherein the display panel includes a direct current voltage input terminal configured to receive the direct current voltage generated by the direct current voltage generation circuit, the scanning signal line drive circuit includes a shift register composed of a plurality of unit circuits provided to correspond to the plurality of scanning signal lines, the shift register being configured to perform a shift operation based on a plurality of clock signals, each unit circuit includes:
a first output node configured to output a scanning signal to a corresponding scanning signal line;
a second output node configured to output a control signal for controlling operations of another unit circuit;
a first node configured to change from an OFF level to an ON level based on a control signal outputted from a second output node of another unit circuit;
a first output control transistor including a control terminal connected to the first node, a first conductive terminal connected to the direct current voltage input terminal, and a second conductive terminal connected to the first output node, and
a second output control transistor including a control terminal connected to the first node, a first conductive terminal given a corresponding clock signal, and a second conductive terminal connected to the second output node, and the direct current voltage generation circuit changes a voltage level of the direct current voltage in each frame period.

In accordance with such a configuration, the first output control transistor in each unit circuit functions as a buffer transistor, and the direct current voltage is given to the first conductive terminal of the first output control transistor. Therefore, there does not occur charge/discharge to capacitance between a control terminal of the first output control transistor and a first conductive terminal thereof, the charge/discharge being caused by the clock operation of the clock signal that operates the shift register. Hence, the power consumption is reduced greatly in comparison with the conventional one. Moreover, in each frame period, the voltage level of the direct current voltage at the direct current voltage input terminal changes. Therefore, variation in magnitude of the scanning voltage (that is, a voltage applied to the scanning signal line at the time of turning the scanning signal line to a selected state) among the scanning signal lines can be reduced. Therefore, the occurrence of the unevenness in display is suppressed. From the above, the liquid crystal display device is achieved, which includes a low-power-consumption scanning signal line drive circuit capable of suppressing the occurrence of the unevenness in display.

These and other objects, features, aspects and effects of the present invention will be more obvious from the following detailed description of the present invention with reference to the accompanying drawings.

BRIEF DESCRIPTION OF THE DRAWINGS

FIG. 34 is a diagram for explaining that a voltage drop of a direct current voltage occurs in a conventional monolithic gate driver that adopts a DC system.

DETAILED DESCRIPTION OF PREFERRED EMBODIMENTS

Embodiments will be described below. Each of the embodiments will be described by taking an example in which n-channel thin film transistors are adopted. Regarding this, as for the n-channel transistor, one with a higher potential between a drain and a source is called a drain; however, in the description of this specification, one is defined as a drain, and the other is defined as a source, and accordingly, a source potential may be higher than a drain potential in some cases. In a second embodiment and after, points different from the first embodiment will be mainly described, and a description of points similar to the first embodiment will be omitted.

0. Functional Configuration and the Like of Display Device

Figure 2:
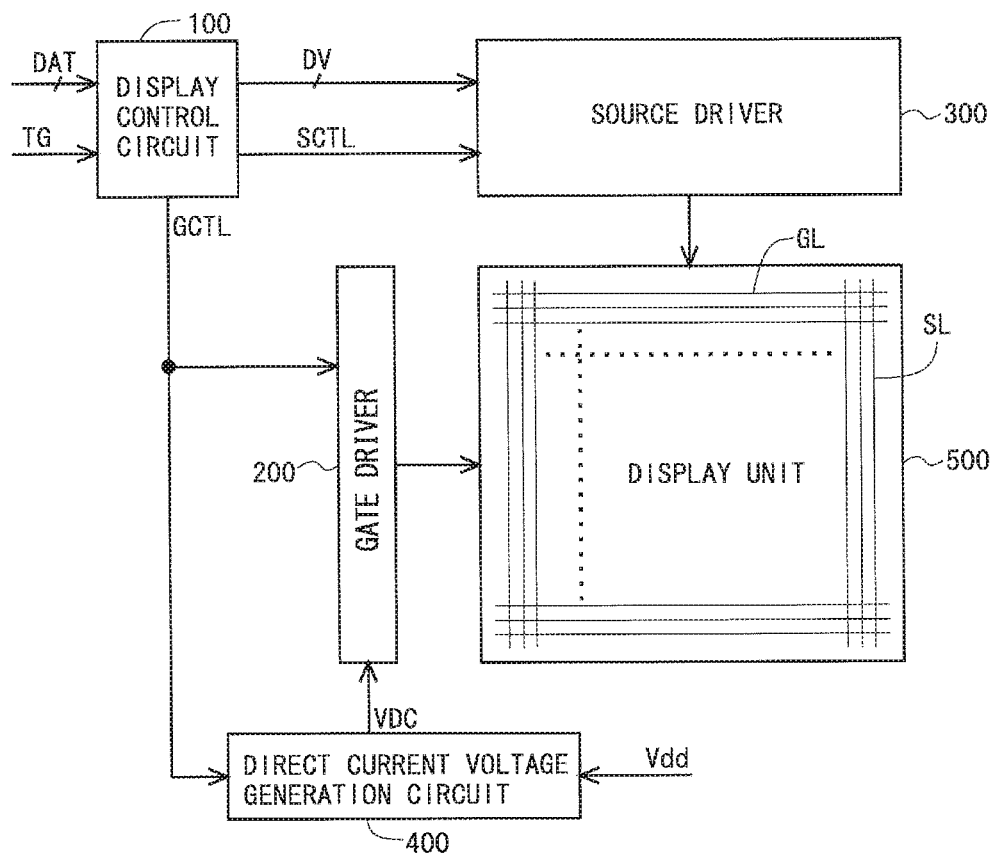
FIG. 2 is a block diagram illustrating a functional configuration of a liquid crystal display device in all embodiments.

First, matters common to all embodiments will be described. FIG. 2 is a block diagram illustrating a functional configuration of a liquid crystal display device in all the embodiments. Since FIG. 2 is a diagram illustrating the functional configuration, a positional relationship between constituents, and the like are different from actual ones. As illustrated in FIG. 2, this liquid crystal display device includes a display control circuit 100, a gate driver 200, a source driver 300, a direct current voltage generation circuit 400 and a display unit 500. The gate driver 200 and the display unit 500 are formed on the same glass substrate. That is, the gate driver 200 is a monolithic gate driver.

Figure 3:
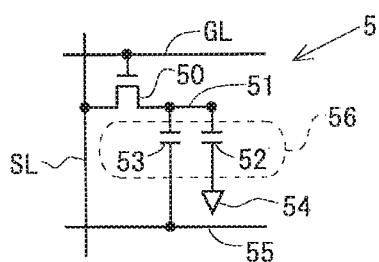
FIG. 3 is a circuit diagram illustrating a configuration of one pixel formation portion in all the embodiments.

Regarding FIG. 2, a plurality of source bus lines (video signal lines) SL and a plurality of gate bus lines (scanning signal lines) GL are arranged on the display unit 500. In the display unit 500, pixel formation portions which form pixels are provided at intersections of the source bus lines SL and the gate bus lines GL. FIG. 3 is a circuit diagram illustrating a configuration of one pixel formation portion 5. The pixel formation portion 5 includes a TFT (thin film transistor) 50 which is a switching element connected at its gate terminal to a gate bus line GL passing through a corresponding intersection, and connected at its source terminal to a source bus line SL passing through the intersection; a pixel electrode 51 connected to a drain terminal of the TFT 50; a common electrode 54 and an auxiliary capacitance electrode 55 which are provided so as to be shared by a plurality of the pixel formation portions formed in the display unit 500; a liquid crystal capacitance 52 formed of an pixel electrode 51 and a common electrode 54; and an auxiliary capacitance 53 formed of the pixel electrode 51 and the auxiliary capacitance electrode 55. The liquid crystal capacitance 52 and the auxiliary capacitance 53 constitute a pixel capacitance 56. Note that the configuration of the pixel formation portion 5 is not limited to the configuration illustrated in FIG. 3, and for example, a configuration in which the auxiliary capacitance and the auxiliary capacitance electrode 55 are not provided can also be adopted.

As the pixel TFT 50, a thin film transistor (an oxide TFT) using an oxide semiconductor for a semiconductor layer is used. As the oxide TFT, a thin film transistor including an oxide semiconductor layer containing, for example, an In—Ga—Zn—O-based semiconductor (for example, indium gallium zinc oxide) can be adopted. These points also apply to thin film transistors in the gate driver 200. Use of the oxide TFT makes it possible to reduce, for example, an off leakage. Note that the present invention can also be applied to cases of using, as the pixel TFT 50 and the thin film transistors in the gate driver 200, thin film transistors (a-Si TFTs) which use amorphous silicon for semiconductor layers, thin film transistors which use microcrystalline silicon for semiconductor layers, thin film transistors (LTPS-TFTs) which use low temperature polysilicon for semiconductor layers, and the like.

Operations of the constituents illustrated in FIG. 2 will be described below. The display control circuit 100 receives an image signal DAT and a timing signal group TG such as a horizontal synchronization signal and a vertical synchronization signal, which are sent from an external source, and outputs a digital video signal DV, a gate control signal GCTL for controlling an operation of the gate driver 200, and a source control signal SCTL for controlling an operation of the source driver 300. The gate control signal GCTL includes a gate start pulse signal, a gate clock signal, and the like. The source control signal SCTL includes a source start pulse signal, a source clock signal, a latch strobe signal, and the like.

On the basis of the gate control signal GCTL sent from the display control circuit 100, the direct current voltage generation circuit 400 generates a direct current voltage VDC, which is to be supplied to the gate driver 200, from a direct current power supply voltage Vdd supplied by a predetermined power supply circuit (not illustrated). At this time, the direct current voltage generation circuit 400 changes a voltage level of the direct current voltage VDC in each frame period. This will be described later in detail. Note that the direct current voltage VDC generated by the direct current voltage generation circuit 400 is a voltage having a voltage level to turn the gate bus line GL to a selected state.

The gate driver 200 repeats application of an active scanning signal to each gate bus line GL with one vertical scanning period as a cycle, on the basis of the gate control signal GCTL sent from the display control circuit 100 and of the direct current voltage VDC supplied from the direct current voltage generation circuit 400. That is, the gate driver 200 performs vertical scanning by sequentially turning the plurality of gate bus lines GL to the selected state in each frame period.

Figure 4:
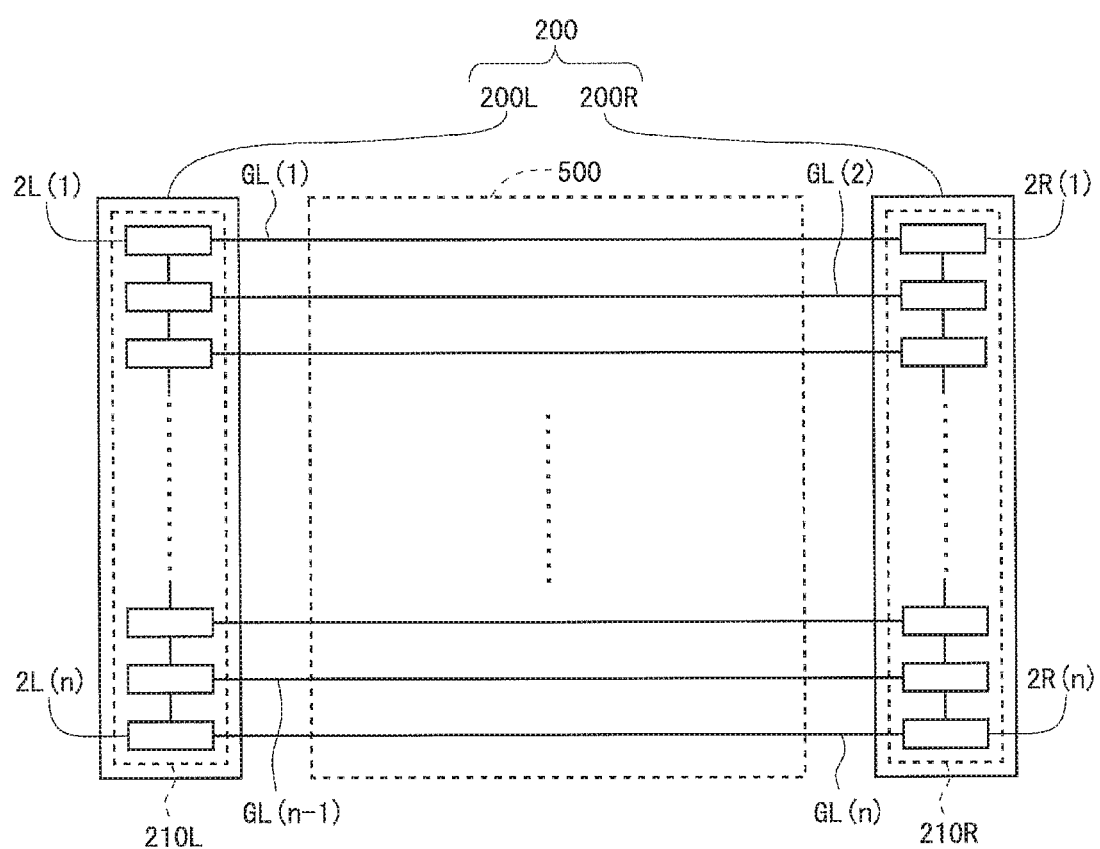
FIG. 4 is a block diagram for explaining a schematic configuration of a gate driver in all the embodiments.

Incidentally, for example, as illustrated in FIG. 4, the gate driver 200 is composed of a gate driver 200L including a shift register 210L disposed on one end side of the display unit 500 and a gate driver 200R including a shift register 210R disposed on the other end side of the display unit 500. The shift register 210L includes n pieces of unit circuits 2L(1) to 2L(n) provided to correspond to the plurality ("n pieces" here) of gate bus lines GL(1) to GL(n). Likewise, the shift register 210R includes n pieces of unit circuits 2R(1) to 2R(n) provided to correspond to the n pieces of gate bus lines GL(1) to GL(n). The shift registers 210L and 210R are configured to perform shift operations on the basis of a plurality of clock signals (gate clock signals). Each of the gate bus lines GL(1) to GL(n) is driven by both of the shift register 210L and the shift register 210R.

The source driver 300 applies driving video signals to the source bus lines SL on the basis of the digital video signals DV and the source control signal SCTL, which are sent from the display control circuit 100. At this time, the source driver 300 sequentially holds the digital video signals DV, which indicate voltages to be applied to the respective source bus lines SL, at pieces of timing when pulses of the source clock signal are generated. Then, the held digital video signals DV are converted to analog voltages at a timing when a pulse of the latch strobe signal is generated. The converted analog voltages are simultaneously applied as driving video signals to all the source bus lines SL.

The scanning signals are applied to the gate bus lines GL and the driving video signals are applied to the source bus lines SL as described above, whereby an image corresponding to the image signal DAT sent from the external source is displayed on the display unit 500.

Incidentally, the configuration of the gate driver 200 out of the constituents illustrated in FIG. 2 differs for each of the embodiments. Accordingly, detailed configuration, operation and the like of the gate driver 200 will be described below for each of the embodiments.

1. First Embodiment

1.1 Relationship Between Positions of Direct Current Voltage Input Terminals and Vertical Scanning Direction A description will be made of a relationship between positions of direct current voltage input terminals 64 and a vertical scanning direction with reference to FIG. 5. A liquid crystal panel 60 that constitutes the liquid crystal display device includes two glass substrates. One of the glass substrates is called an array substrate, and the other of the glass substrates is called a counter substrate. The array substrate and the counter substrate are pasted to each other, for example, by a sealing material. An area of the array substrate is larger than an area of the counter substrate. Hence, in a region on the array substrate, there is a picture-frame region 62 that is a region that does not face the counter substrate. Note that, in the present specification, a region where the array substrate and the counter substrate completely face each other (a region denoted by reference numeral 61 in FIG. 5) will be referred to as an "active region".

Figure 5:
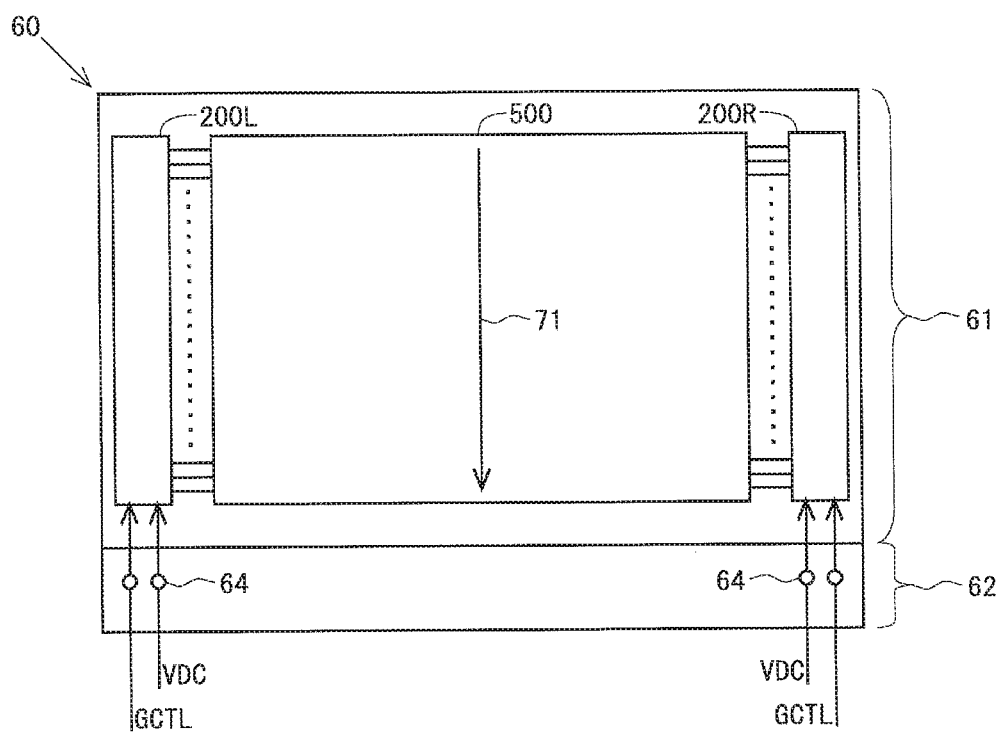
FIG. 5 is a diagram for explaining a relationship between positions of direct current voltage input terminals and a vertical scanning direction in the first embodiment.

In the present embodiment, as illustrated in FIG. 5, the picture-frame region 62 is provided below the active region 61. The display unit 500 and the gate drivers 200L and 200R are provided in the active region 61. In such a configuration, in each frame period, the gate bus lines GL are sequentially turned to the selected state one by one from above to below in FIG. 5. That is, the vertical scanning direction is a direction illustrated by an arrow denoted by reference numeral 71 in FIG. 5. Note that, hereinafter, a side on which there is a gate bus line GL turned to the selected state first in each frame period will be referred to as a "vertical scanning start side", and a side on which there is gate bus line GL turned to the selected state last in each frame period will be referred to as a "vertical scanning end side". As illustrated in FIG. 5, the gate control signal GCTL and the direct current voltage VDC are inputted to the gate drivers 200L and 200R from the picture-frame region 62 side. That is, in the present embodiment, the direct current voltage input terminals 64 which receive the direct current voltage VDC generated by the direct current voltage generation circuit 400 are provided on the vertical scanning end side on the liquid crystal panel 60, and the direct current voltage VDC is inputted to the gate drivers 200L and 200R not from the vertical scanning start side but from the vertical scanning end side. Since the gate control signal GCTL is composed of a plurality of signals, a plurality of input terminals for the gate control signal GCTL are actually present on each of right and left sides in FIG. 5. However, for convenience, FIG. 5 illustrates only one input terminal for the gate control signal GCTL on each of right and left sides.

With regard to a variety of signals (a set signal, a reset signal and the like, which will be described later) generated by the monolithic gate driver, waveforms thereof tend to be deformed as the vertical scanning advances in each frame period. Hence, preferably, the input of the gate control signal GCTL and the direct current voltage VDC to the gate drivers 200L and 200R is performed from the vertical scanning end side as in the present embodiment.

1.2 Configuration of Gate Driver

1.2.1 Configuration of Shift Register

Figure 6:
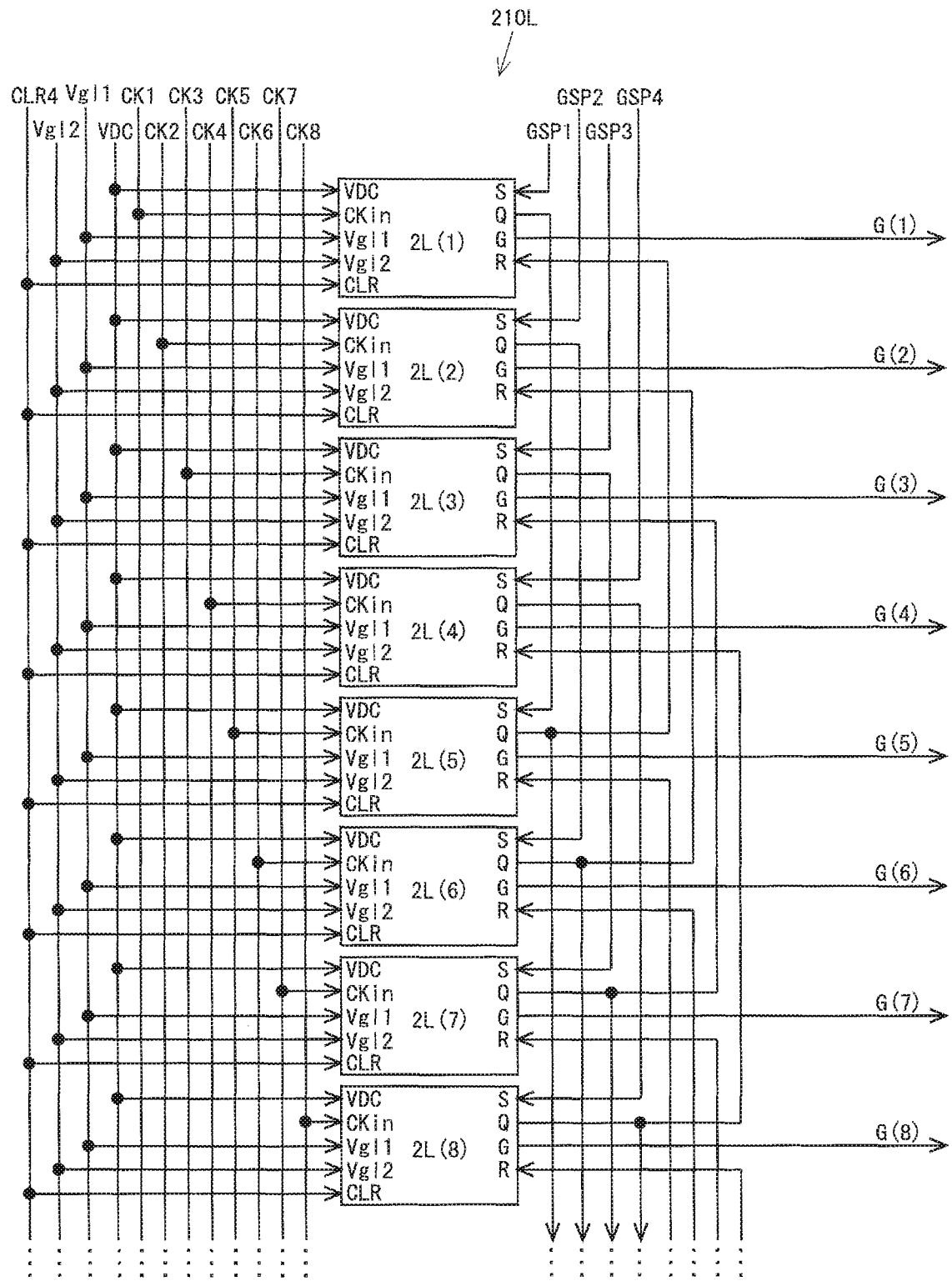
FIG. 6 is a block diagram illustrating a configuration of a shift register in a gate driver in the first embodiment.

FIG. 6 is a block diagram illustrating a configuration of the shift register 210L in the gate driver 200L. The shift register 210L is composed of the n pieces of unit circuits 2L(1) to 2L(n) as mentioned above; however, FIG. 6 illustrates only the unit circuits 2L(1) to 2L(8) corresponding to the gate bus lines GL(1) to GL(8) on first to eighth rows. The shift register 210L and the shift register 210R are configured in the same way as seen from FIG. 4, and accordingly, hereinafter only the configuration of the shift register 210L will be described, and a description of the configuration of the shift register 210R will be omitted. Hereinafter, when an unspecified unit circuit in the shift register 210L is mentioned, the unit circuit will be denoted by reference symbol 2L, and when an unspecified unit circuit in the shift register 210L and the shift register 210R is mentioned, the unit circuit will be denoted by reference numeral 2.

In the present embodiment, as low-level direct current power supply voltages for controlling the operation of the gate driver 200, there are prepared: a first gate low voltage Vgl1 having a voltage level conventionally used for turning the pixel TFT 50 to an off state (turning the gate bus line GL to a non-selected state); and a second gate low voltage Vgl2 having a voltage level lower than the voltage level of the first gate low voltage Vgl1. While details will be described later, a reason why two types of gate low voltages are prepared as described above is to achieve a rapid drop of a gate output (a voltage of a scanning signal outputted from the gate driver 200). Hereinafter, the voltage level of the first gate low voltage Vgl1 will be referred to as a "first low level", and the voltage level of the second gate low voltage Vgl2 will be referred to as a "second low level". In the accompanying drawings (FIG. 8 and the like), the voltage level same as the voltage level of the first gate low voltage is represented by reference symbol Vgl1, the voltage level same as the voltage level of the second gate low voltage is represented by reference symbol Vgl2, and the voltage level same as a voltage level of a gate high voltage to be described later is represented by reference symbol Vgh.

As illustrated in FIG. 6, the shift register 210L is given, as the gate control signal GCTL, gate clock signals CK1 to CK8, gate start pulse signals GSP1 to GSP4, and clear signals CLR1 to CLR4 (note that the clear signals CLR1 to CLR3 are not illustrated in FIG. 6). Moreover, the shift register 210L is also given the first gate low voltage Vgl1, the second gate low voltage Vgl2, and the direct current voltage VDC generated by the above-mentioned direct current voltage generation circuit 400. The gate clock signals CK1 to CK8 are 8-phase clock signals. Regarding those 8-phase clock signals, clock signals inputted to the respective unit circuits 2L (hereinafter, each of the clock signals will be referred to as "input clock signal") are denoted by reference symbol CKin.

Signals to be given to the input terminals of the respective stages (respective unit circuits 2L) of the shift register circuit 210L are as follows. As the input clock signal CKin, the gate clock signal CK1 is given to the unit circuit 2L(1) at the first stage, the gate clock signal CK2 is given to the unit circuit 2L(2) at the second stage, the gate clock signal CK3 is given to the unit circuit 2L(3) at the third stage, the gate clock signal CK4 is given to the unit circuit 2L(4) at the fourth stage, the gate clock signal CK5 is given to the unit circuit 2L(5) at the fifth stage, the gate clock signal CK6 is given to the unit circuit 2L(6) at the sixth stage, the gate clock signal CK7 is given to the unit circuit 2L(7) at the seventh stage, and the gate clock signal CK8 is given to the unit circuit 2L(8) at the eighth stage. Such a configuration is repeated every eight stages throughout all the stages of the shift register 210L.

The unit circuit 2L(1) at the first stage is given the gate start pulse signal GSP1 as a set signal S, the unit circuit 2L(2) at the second stage is given the gate start pulse signal GSP2 as a set signal S, the unit circuit 2L(3) at the third stage is given the gate start pulse signal GSP3 as a set signal S, and the unit circuit 2L(4) at the fourth stage is given the gate start pulse signal GSP4 as a set signal S. Assuming that k is an integer of 5 or more and n or less, a unit circuit 2L(k) at a k-th stage is given, as a set signal S, an output signal Q(k−4) outputted from a unit circuit 2L(k−4) at a (k−4)-th stage.

Assuming that k is an integer of 1 or more and (n−4) or less, a unit circuit 2L(k) at a k-th stage is given, as a reset signal R, an output signal Q(k+4) outputted from a unit circuit 2L(k+4) at a (k+4)-th stage. A unit circuit 2L(n−3) at an (n−3)-th stage is given the clear signal CLR1 as a reset signal R, a unit circuit 2L(n−2) at an (n−2)-th stage is given the clear signal CLR2 as a reset signal R, a unit circuit 2L(n−1) at an (n−1)-th stage is given the clear signal CLR3 as a reset signal R, and a unit circuit 2L(n) at an (n)-th stage is given the clear signal CLR4 as a reset signal R.

The first gate low voltage Vgl1, the second gate low voltage Vgl2, and the direct current voltage VDC are commonly given to all the unit circuits 2L(1) to 2L(n). Moreover, the clear signal CLR4 is given as a clear signal CLR commonly to all the unit circuits 2L(1) to 2L(n).

Output signals Q and G are outputted from the respective unit circuits 2L of the shift register 210L. Assuming that k is an integer of 1 or more and n or less, an output signal G outputted from the unit circuit 2L(k) at the k-th stage is given as a scanning signal G(k) to a gate bus line GL(k). Assuming that k is an integer of 1 or more and 4 or less, an output signal Q outputted from the unit circuit 2L(k) at the k-th stage is given as a set signal to a unit circuit 2L(k+4) at a (k+4)-th stage. Assuming that k is an integer of 5 or more and (n−4) or less, an output signal Q outputted from the unit circuit 2L(k) at the k-th stage is given as a reset signal to a unit circuit 2L(k−4) at the (k−4)-th stage, and is given as a set signal to the unit circuit 2L(k+4) at the (k+4)-th stage. Assuming that k is an integer of (n−3) or more and n or less, the output signal Q outputted from the unit circuit 2L(k) at the k-th stage is given as a reset signal to the unit circuit 2L(k−4) at the (k−4)-th stage.

Though the description is made herein by taking an example of using four gate start pulse signals GSP1 to GSP4 and four clear signals CLR1 to CLR4, the number of gate start pulse signals may be reduced by providing the vertical scanning start side with a unit circuit that functions as a dummy stage, or the number of clear signals may be reduced by providing the vertical scanning end side with a unit circuit that functions as a dummy stage.

1.2.2 Configuration of Unit Circuit

Figure 7:
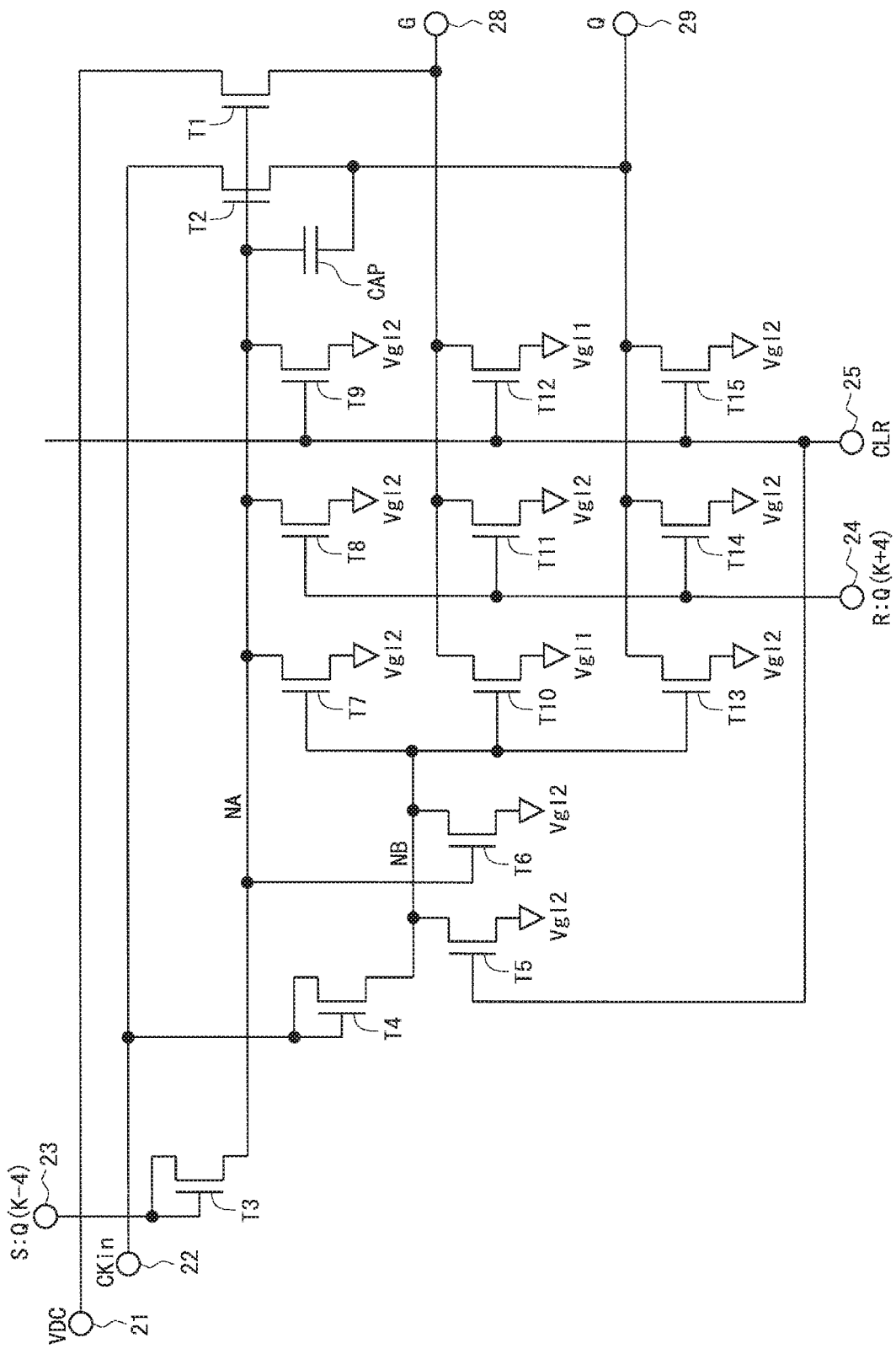
FIG. 7 is a circuit diagram illustrating a configuration of a unit circuit in the first embodiment.

FIG. 7 is a circuit diagram illustrating a configuration of the unit circuit 2 in the present embodiment. Note that the unit circuit 2 illustrated in FIG. 7 is assumed to be connected to the K-th-row gate bus line GL(K). As illustrated in FIG. 7, this unit circuit 2 includes 15 thin film transistors T1 to T15 and one capacitor (capacitance element) CAP. This unit circuit 2 further includes five input terminals 21 to 25 and two output terminals 28 and 29 as well as an input terminal for the first gate low voltage Vgl1 and an input terminal for the second gate low voltage Vgl2. Here, an input terminal that receives the direct current voltage VDC is denoted by reference numeral 21, an input terminal that receives the input clock signal CKin is denoted by reference numeral 22, an input terminal that receives the set signal S is denoted by reference numeral 23, an input terminal that receives the reset signal R is denoted by reference numeral 24, and an input terminal that receives the clear signal CLR is denoted by reference numeral 25. Moreover, an output terminal that outputs the output signal G is denoted by reference numeral 28, and an output terminal that outputs the output signal Q is denoted by reference numeral 29.

Next, a connection relationship between the constituents in the unit circuit 2 will be described. A gate terminal of the thin film transistor T1, a gate terminal of the thin film transistor T2, a source terminal of the thin film transistor T3, a gate terminal of the thin film transistor T6, a drain terminal of the thin film transistor T7, a drain terminal of the thin film transistor T8, a drain terminal of the thin film transistor T9 and one end of the capacitor CAP are connected to one another through a first node NA. A source terminal of the thin film transistor T4, a drain terminal of the thin film transistor T5, a drain terminal of the thin film transistor T6, a gate terminal of the thin film transistor T7, a gate terminal of the thin film transistor T10 and a gate terminal of the thin film transistor T13 are connected to one another through a second node NB.

The thin film transistor T1 is connected at its gate terminal to the first node NA, connected at its drain terminal to the input terminal 21, and connected at its source terminal to the output terminal 28. The thin film transistor T2 is connected at its gate terminal to the first node NA, connected at its drain terminal to the input terminal 22, and connected at its source terminal to the output terminal 29. The thin film transistor T3 is connected at its gate terminal and drain terminal to the input terminal 23 (that is, forms a diode connection) and connected at its source terminal to the first node NA. The thin film transistor T4 is connected at its gate terminal and drain terminal to the input terminal 22 (that is, forms a diode connection) and connected at its source terminal to the second node NB. The thin film transistor T5 is connected at its gate terminal to the input terminal 25, connected at its drain terminal to a second node NB, and connected at its source terminal to the input terminal for the second gate low voltage Vgl2.

The thin film transistor T6 is connected at its gate terminal to the first node NA, connected at its drain terminal to the second node NB, and connected at its source terminal to the input terminal for the second gate low voltage Vgl2. The thin film transistor T7 is connected at its gate terminal to the second node NB, connected at its drain terminal to the first node NA, and connected at its source terminal to the input terminal for the second gate low voltage Vgl2. The thin film transistor T8 is connected at its gate terminal to the input terminal 24, connected at its drain terminal to the first node NA, and connected at its source terminal to the input terminal for the second gate low voltage Vgl2. The thin film transistor T9 is connected at its gate terminal to the input terminal 25, connected at its drain terminal to the first node NA, and connected at its source terminal to the input terminal for the second gate low voltage Vgl2. The thin film transistor T10 is connected at its gate terminal to the second node NB, connected at its drain terminal to the output terminal 28, and connected at its source terminal to the input terminal for the first gate low voltage Vgl1.

The thin film transistor T11 is connected at its gate terminal to the input terminal 24, connected at its drain terminal to the output terminal 28, and connected at its source terminal to the input terminal for the second gate low voltage Vgl2. The thin film transistor T12 is connected at its gate terminal to the input terminal 25, connected at its drain terminal to the output terminal 28, and connected at its source terminal to the input terminal for the first gate low voltage Vgl1. The thin film transistor T13 is connected at its gate terminal to the second node NB, connected at its drain terminal to the output terminal 29, and connected at its source terminal to the input terminal for the second gate low voltage Vgl2. The thin film transistor T14 is connected at its gate terminal to the input terminal 24, connected at its drain terminal to the output terminal 29, and connected at its source terminal to the input terminal for the second gate low voltage Vgl2. The thin film transistor T15 is connected at its gate terminal to the input terminal 25, connected at its drain terminal to the output terminal 29, and connected at its source terminal to the input terminal for the second gate low voltage Vgl2. The capacitor CAP is connected at its one end to the first node NA and connected at its other end to the output terminal 29.

Next, functions of the respective constituents will be described. The thin film transistor T1 gives the direct current voltage VDC to the output terminal 28 when a potential of the first node NA is at a high level. The thin film transistor T2 gives a potential of the input clock signal CLKin to the output terminal 29 when the potential of the first node NA is at the high level. The thin film transistor T3 changes the potential of the first node NA toward the high level when the set signal S is at the high level. The thin film transistor 14 changes a potential of the second node NB toward the high level when the input clock signal CLKin is at the high level. The thin film transistor T5 changes the potential of the second node NB toward the second low level when the clear signal CLR is at the high level. The thin film transistor T6 changes the potential of the second node NB toward the second low level when the potential of the first node NA is at the high level. The thin film transistor T7 changes the potential of the first node NA toward the second low level when the potential of the second node NB is at the high level. The thin film transistor T8 changes the potential of the first node NA toward the second low level when the reset signal R is at the high level. The thin film transistor T9 changes the potential of the first node NA toward the second low level when the clear signal CLR is at the high level. The thin film transistor T10 changes a potential of the output terminal 28 (that is, a potential of the output signal G) toward the first low level when the potential of the second node NB is at the high level. The thin film transistor T11 changes the potential of the output terminal 28 toward the second low level when the reset signal R is at the high level. The thin film transistor T12 changes the potential of the output terminal 28 toward the first low level when the clear signal CLR is at the high level. The thin film transistor T13 changes a potential of the output terminal 29 (that is, a potential of the output signal Q) toward the second low level when the potential of the second node NB is at the high level. The thin film transistor 114 changes the potential of the output terminal 29 toward the second low level when the reset signal R is at the high level. The thin film transistor T15 changes the potential of the output terminal 29 toward the second low level when the clear signal CLR is at the high level. The capacitor CAP functions as a boost capacitance for increasing the potential of the first node NA.

Note that a first output control transistor is achieved by the thin film transistor T1, a second output control transistor is achieved by the thin film transistor T2, a second node turn-off transistor is achieved by the thin film transistor T6, a first first-output-node turn-off transistor is achieved by the thin film transistor T10, a second first-output-node turn-off transistor is achieved by the thin film transistor T11, a first output node is achieved by the output terminal 28, and a second output node is achieved by the output terminal 29.

1.3 Driving Method

Figure 8:
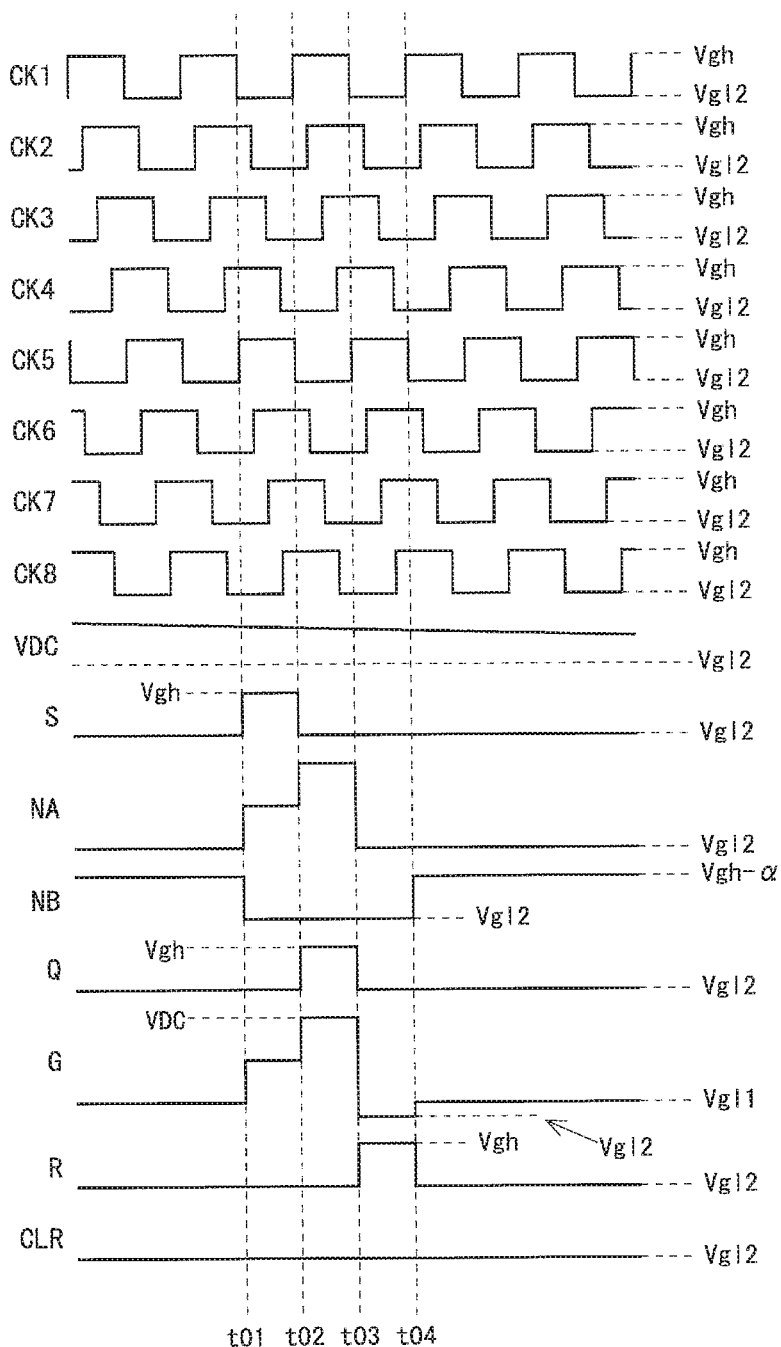
FIG. 8 is a timing chart for explaining operations of the unit circuit in the first embodiment.

With reference to FIG. 8, a description will be given of the operation of the unit circuit 2 in the present embodiment. Here, attention is paid to the unit circuit 2 to which the gate clock signal CK1 is inputted as the input clock signal CKin, and it is assumed that a delay of a waveform is ignored. Note that, in FIG. 8, each of a period from time point t01 to time point t02, a period from time point t02 to time point t03 and a period from time point t03 to time point t04 is four horizontal scanning periods. That is, a period corresponding to a pulse width of the gate clock signals CK1 to CK8 is longer than one horizontal scanning period.

Throughout an operation period of the liquid crystal display device, each of the gate clock signals CK1 to CK8 alternately repeats the high level and the low level. The high level voltage of the gate clock signals CK1 to CK8 is a voltage (hereinafter, referred to as a "gate high voltage") Vgh having a voltage level to turn the gate bus line GL to a selected state. A low level voltage of the gate clock signals CK1 to CK8 is the second gate low voltage Vgl2 in the present embodiment.

In a period before time point t01, the set signal S is at the second low level, the potential of the first node NA is at the second low level, the potential of the second node NB is at the high level, the output signal Q is at the second low level, the output signal G is at the first low level, the reset signal R is at the second low level, and the clear signal CLR is at the second low level. Incidentally, parasitic capacitance is present in the thin film transistors in the unit circuit 2. Therefore, in the period before time point t01, the potential of the first node NA may fluctuate due to a clock operation of the input clock signal CKin and presence of the parasitic capacitance of the thin film transistors T1 and T2. As a result, the potential of the output signal G may rise. However, in a period in which the potential of the second node NB is maintained at the high level, the thin film transistor T7 is maintained to be in an ON state. Hence, in the period before time point t01, the thin film transistor T7 is maintained to be in an ON state, and the potential of the first node NA is surely maintained in the second low level. From the above, even when noise caused by the clock operation of the input clock signal CKin is mixed into the first node NA, the potential of the output signal G does not rise. In this way, a malfunction such as a display failure caused by clock operations of the gate clock signals CK1 to CK8 is prevented from occurring.

When time point t01 comes, the set signal S changes from the second low level to the high level. As illustrated in FIG. 7, the thin film transistor T3 forms the diode connection. Accordingly, the pulse of the set signal S turns the thin film transistor T3 to the ON state, and the potential of the first node NA rises. Thereby, the thin film transistors T1, T2 and T6 turn to the ON state. By the thin film transistor T1 turning to the ON state, the potential of the output signal G rises. The potential of the output signal G rises to a potential corresponding to a voltage level lower than the voltage level of the direct current voltage VDC by an amount of a threshold voltage of the thin film transistor T1. Moreover, by the thin film transistor T6 turning to the ON state, the potential of the second node NB turns to the second low level. Note that, in the period from time point t01 to time point t02, the input clock signal CKin (gate clock signal CK1) is at the second low level. Accordingly, although the thin film transistor T2 turns to the ON state, the output signal Q is maintained at the second low level. Moreover, in the period from time point t01 to time potential t02, the reset signal R and the clear signal CLR are maintained at the second low level, and the potential of the second node NB is also maintained at the second low level. Hence, during this period, the potential of the first node NA does not decrease due to the fact that the thin film transistors T7, T8 and T9 are provided.

When time point t02 comes, the input clock signal CKin changes from the second low level to the high level. At this time, the thin film transistor T2 is in the ON state, and accordingly, the potential of the output terminal 29 rises as the potential of the input terminal 22 rises. Here, the capacitor CAP is provided between the first node NA and the output terminal 29 as illustrated in FIG. 7, and accordingly, the potential of the first node NA rises (the first node NA turns to a boosted state) as the potential of the output terminal 29 rises. As a result, a large voltage is applied to the gate terminals of the thin film transistors T1 and T2, thereby, the potential of the output signal G rises to a potential corresponding to the voltage level of the direct current voltage VDC, and the potential of the output signal Q rises to a potential corresponding to the voltage level of the high level voltage of the input clock signal CKin. That is, the potential of the output signal G becomes the potential corresponding to the voltage level of the direct current voltage VDC, and the potential of the output signal Q becomes the potential corresponding to the voltage level of the gate high voltage Vgh. In the period from time point t02 to time potential t03, the reset signal R and the clear signal CLR are maintained at the second low level, and the potential of the second node NB is also maintained at the second low level. Hence, during this period, the potential of the first node NA does not decrease due to the fact that the thin film transistors T7, T8 and T9 are provided, the potential of the output signal G does not decrease due to the fact that the thin film transistors T10, T11 and T12 are provided, and the potential of the output signal Q does not decrease due to the fact that the thin film transistors T13, 114 and T15 are provided.

When time point t03 comes, the reset signal R changes from the second low level to the high level. Accordingly, the thin film transistors T8, T11 and 114 turn to the ON state. By the thin film transistor T8 turning to the ON state, the potential of the first node NA turns to the second low level, by the thin film transistor T11 turning to the ON state, the output signal G turns to the second low level, and by the thin film transistor 114 turning to the ON state, the output signal Q turns to the second low level.

When time point t04 comes, the input clock signal CKin changes from the second low level to the high level. As illustrated in FIG. 7, the thin film transistor T4 forms the diode connection. Accordingly, the potential of the second node NB turns to the high level by the input clock signal CKin changing from the second low level to the high level. Thereby, the thin film transistors T7, T10 and T13 turn to the ON state. By the thin film transistor T7 turning to the ON state, the potential of the first node NA is pulled to the second low level even when the noise caused by the clock operation of the input clock signal CKin is mixed into the first node NA in a period after time point t04. Moreover, by the thin film transistor T10 turning to the ON state, the output signal G changes from the second low level to the first low level. By the thin film transistor T13 turning to the ON state, the output signal Q is pulled to the second low level even when the noise caused by the clock operation of the input clock signal CKin is mixed into the output terminal 29 in the period after time point t04. Then, in the period after time point t04, a similar operation to that in the period before time point t01 is performed.

Figure 9:
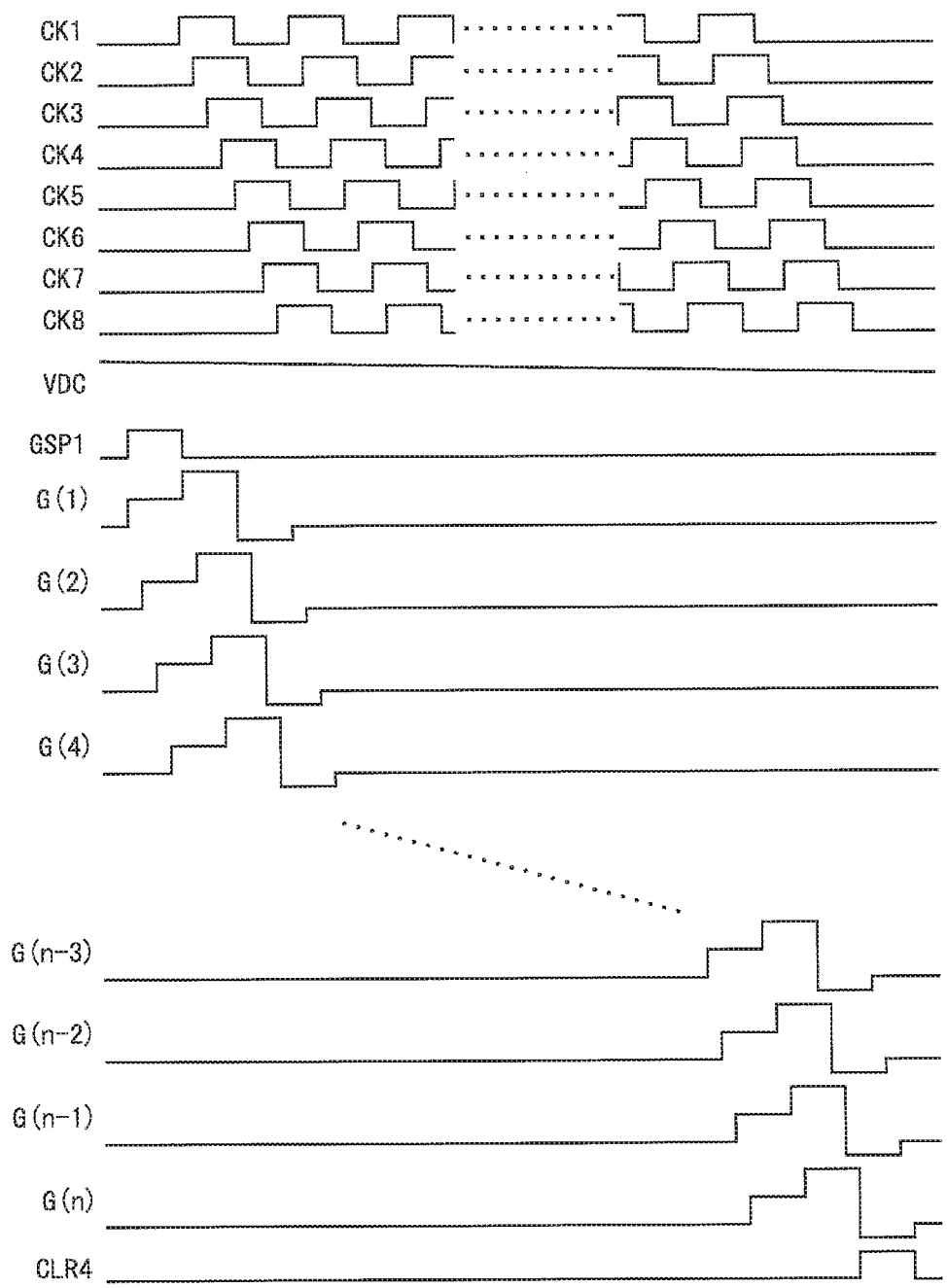
FIG. 9 is a timing chart for explaining a method for driving gate bus lines in the first embodiment.

Such operations as described above are performed in each unit circuit 2 in each frame period, whereby scanning signals G(1) to G(n) applied to the gate bus lines GL(1) to GL(n) provided in this liquid crystal display device sequentially become active (turn to the high level) as illustrated in FIG. 9. In this way, writing to the pixel capacitance 56 (see FIG. 3) is sequentially performed one row by one row, and the image based on the image signal DAT sent from the external source is displayed on the display unit 500.

Note that the clear signal CLR4 turns to the high level after the active scanning signals are applied to all the gate bus lines GL (see FIG. 9). Thereby, in each unit circuit 2, the thin film transistors T9, T12 and T15 turn to the ON state. As a result, the potential of the first node NA, the potential of the output terminal 28 and the potential of the output terminal 29 are pulled to the second low level. That is, states of all the unit circuits 2 are reset. A reason why the states of all the unit circuits 2 are reset as described above is as follows. If the off leakage in the thin film transistors is small, then frame switching is performed in a state where residual charges are accumulated in the internal nodes (the first node NA, the second node NB, and the like) of each unit circuit 2, and the residual charges affect display on a subsequent frame. Particularly, in a case where oxide TFTs are adopted, it is important to reset the states of all the unit circuits 2 as described above. Moreover, also at the time when the power supply of the liquid crystal display device is off, preferably, the clear signal CLR4 is raised to the high level to reset the states of all the unit circuits 2.

Moreover, in the present embodiment, at the time of dropping the gate output, the potential of the output signal G changes to the voltage level of the first gate low voltage Vgl after temporarily decreasing from the voltage level of the direct current voltage VDC to the voltage level of the second gate low voltage Vgl2 as illustrated in FIG. 8. The potential of the output signal G is temporarily pulled to the lower potential, whereby a change rate of the potential of the output signal G is increased more than conventional one. As a result, a rapid drop of the gate output is realized.

Figure 1:
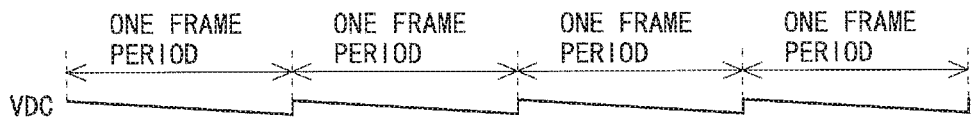
FIG. 1 is a diagram for explaining a change of a voltage level of a direct current voltage in a first embodiment.

Here, the voltage level of the direct current voltage VDC in the present embodiment will be described. As mentioned above, in the present embodiment, the direct current voltage input terminals 64 are provided on the vertical scanning end side on the liquid crystal panel 60 (see FIG. 5). Therefore, the voltage drop of the direct current voltage VDC is increased as the vertical scanning start side is closer. Accordingly, on the basis of the gate control signal GCTL, the direct current voltage generation circuit 400 gradually decreases the voltage level of the direct current voltage VDC in each frame period as illustrated in FIG. 1. As seen from FIG. 1, a frequency of the voltage level of the direct current voltage VDC is equal to a frame frequency. As illustrated in FIG. 1, the voltage level of the direct current voltage VDC at direct current voltage input terminal 64 is highest at the time of driving the first-row gate bus line GL(1), and is lowest at the time of driving the n-th-row gate bus line GL(n). Since the voltage level of the direct current voltage VDC changes in this manner, variation in magnitude of the scanning voltage (the voltage actually applied as the active scanning signal to the gate bus line GL) among the n pieces of gate bus lines GL is smaller than conventional ones. As a result, the unevenness in display, which is caused by the voltage drop of the direct current voltage VDC, is suppressed from occurring.

An amount of change in the voltage level of the direct current voltage VDC in each frame period may be changed depending on an accumulated operation time of the liquid crystal panel 60 in consideration of a deterioration of a circuit element in the liquid crystal panel 60, and the like.

1.4 Effect

Figure 10:
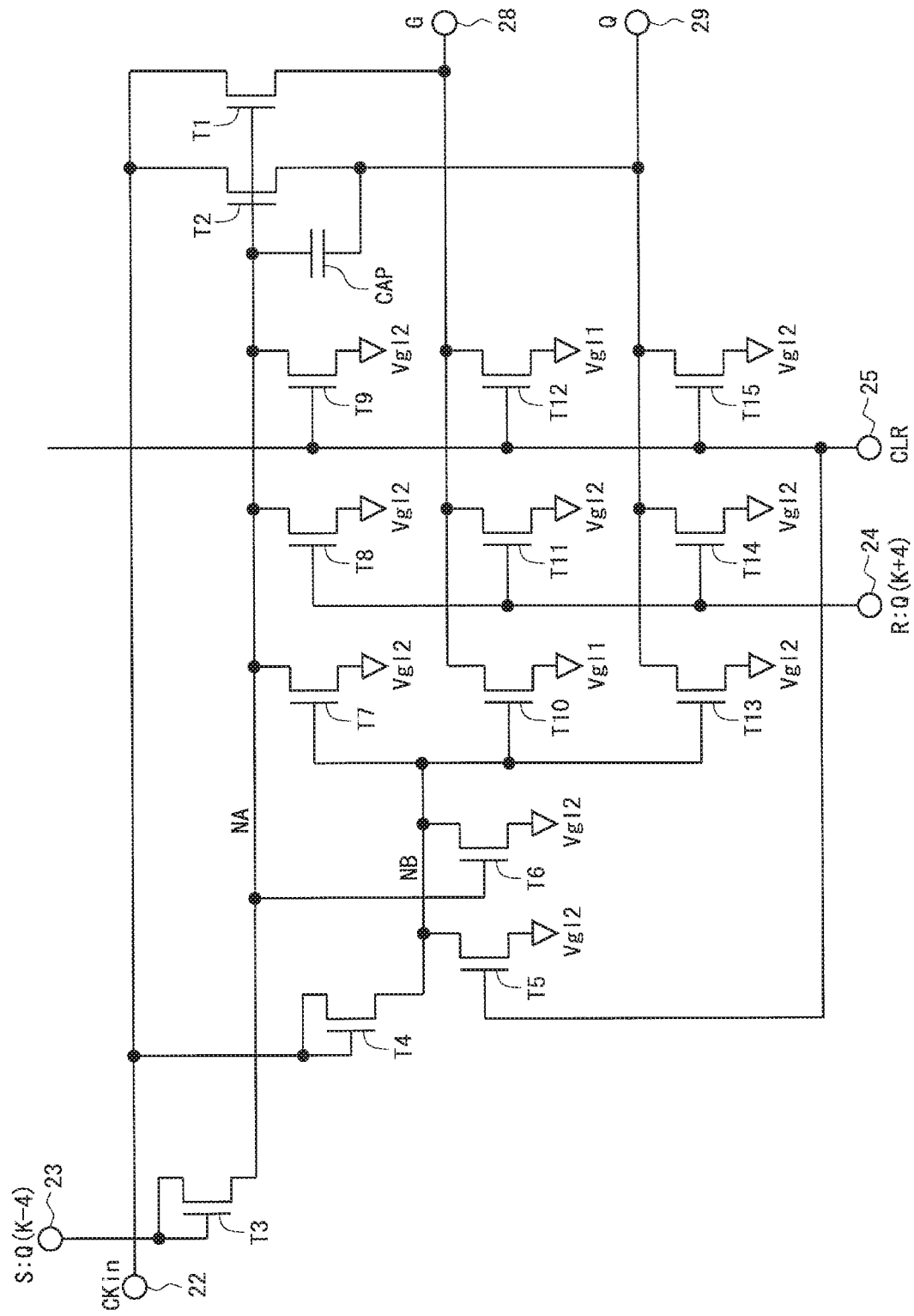
FIG. 10 is a circuit diagram illustrating a conventional unit circuit.

Effects in the present embodiment will be described below while being compared with those of a conventional example. In a case in which a monolithic gate driver with a system of applying a high level voltage of a clock signal as an active scanning signal to a gate bus line through a buffer transistor (that is, a monolithic gate driver including a shift register composed of a unit circuit with a configuration as illustrated in FIG. 10) is adopted, charge/discharge to capacitances between the gate terminal and the drain terminal of the thin film transistors T1 and T2 is repeated by a clock operation of a gate clock signal. This charge/discharge is performed on all the stages (unit circuits) of the shift register during a period in which the clock operation of the gate clock signal is being performed. Therefore, as the number of gate bus lines is increased, the number of transistors in which the charge/discharge is performed is increased, and accordingly, a power consumption is increased. Moreover, as a size of the panel is increased, wiring resistance of the gate bus lines and capacitance are increased. Therefore, in order to rapidly raise the gate output in the liquid crystal display device increased in size, it is necessary to increase a size of the thin film transistor T1 (buffer transistor) so that a charge supply capability is increased. However, if the size of the thin film transistor T1 is increased, then the capacitance between the gate terminal and the drain terminal is increased. Accordingly, the power consumption due to the above-mentioned charge/discharge caused by the clock operation is increased. From the above, according to the conventional example, the power consumption is significantly increased particularly when a high-definition large panel is adopted.

In contrast, according to the present embodiment, the direct current voltage VDC is given to the drain terminal of the thin film transistor T1 that functions as a buffer transistor. Therefore, there does not occur the charge/discharge to the capacitance between the gate terminal and the drain terminal of the thin film transistor T1, the charge/discharge being caused by the clock operation of the signal given to the drain terminal of the thin film transistor T1. Hence, the power consumption is reduced greatly in comparison with the conventional example. Note that, though the charge/discharge to the capacitance between the gate terminal and the drain terminal of the thin film transistor T2 is performed also in the present embodiment, it is not necessary to increase the size of the thin film transistor T2 as much as the size of the thin film transistor T1, and accordingly, such an influence given to the power consumption can be reduced by keeping the size of the thin film transistor T2 small.

Figure 11:
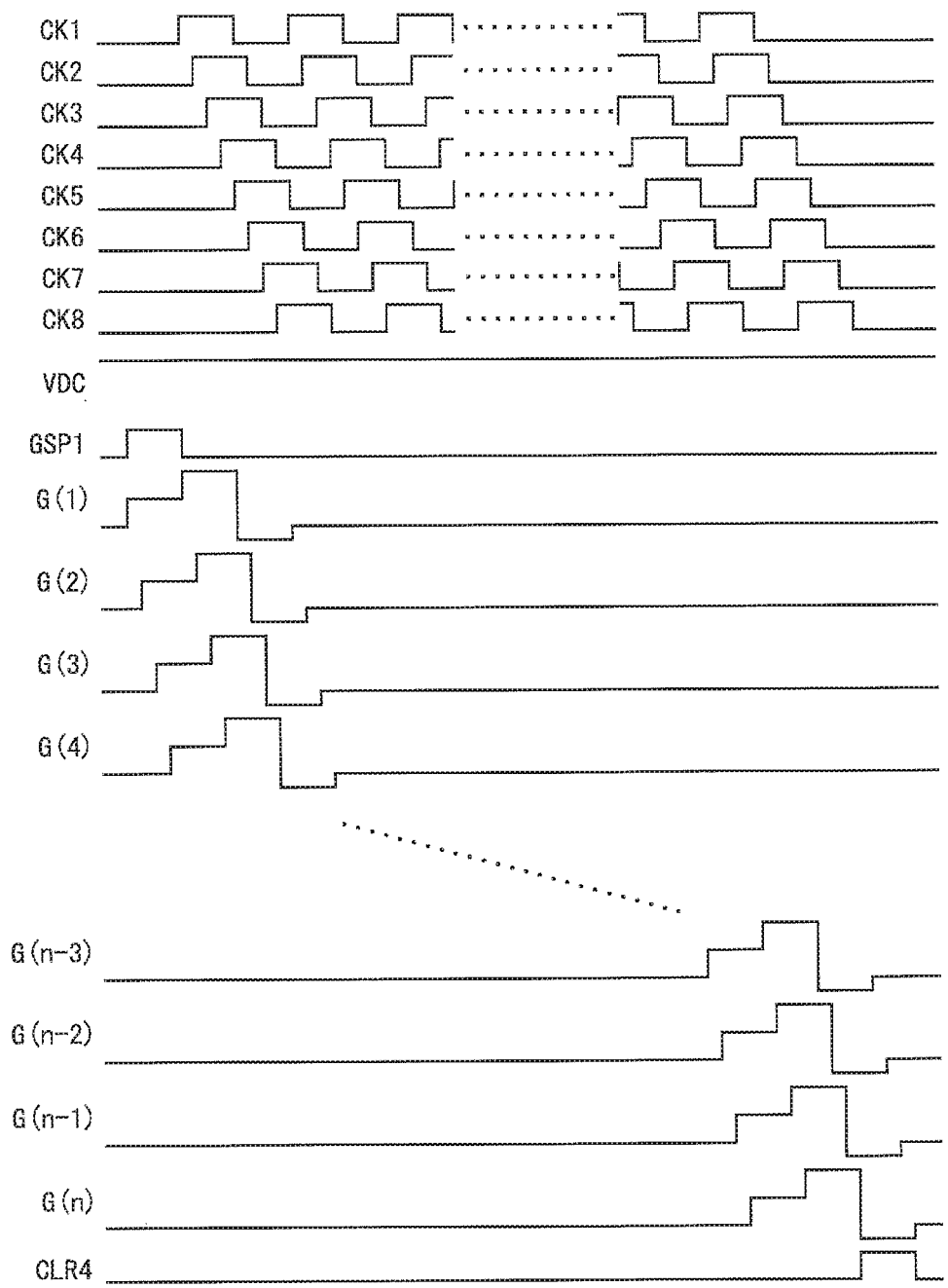
FIG. 11 is a timing chart for explaining a conventional example.

Moreover, when the magnitude of the direct current voltage VDC inputted to the gate driver is constant as illustrated in FIG. 11, the more distant a position from the direct current voltage input terminal is, the larger the voltage drop of the direct current voltage VDC is, and accordingly, variation in the magnitude of the scanning voltage among the gate bus lines occur, and the unevenness in display is brought about.

In contrast, according to the present embodiment, the voltage level of the direct current voltage VDC at each direct current voltage input terminal 64 gradually decreases in each frame period. Therefore, variation in the magnitude of the scanning voltage among the gate bus lines GL is reduced. Therefore, the occurrence of the unevenness in display is suppressed.

From the above, according to the present embodiment, the liquid crystal display device is achieved, which includes the low-power-consumption gate driver 200 capable of suppressing the occurrence of the unevenness in display.

1.5 Modified Examples

1.5.1 First Modified Example

Figure 12:
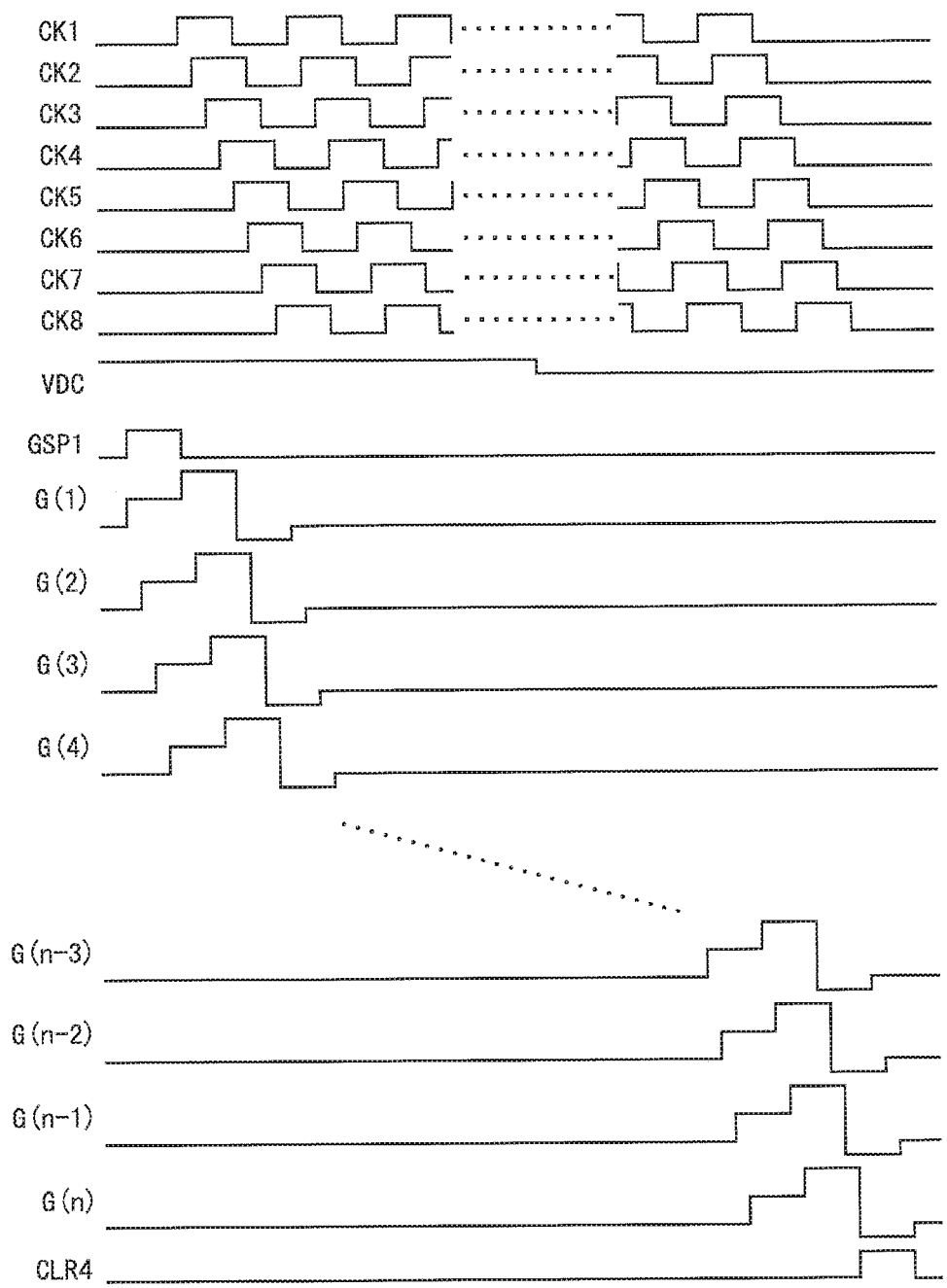
FIG. 12 is a timing chart for explaining a change of the voltage level of the direct current voltage in a first modified example of the first embodiment.

In the first embodiment, the direct current voltage generation circuit 400 gradually decreases the voltage level of the direct current voltage VDC in each frame period. However, the present invention is not limited to this. The direct current voltage generation circuit 400 may decrease the voltage level of the direct current voltage VDC step by step in each frame period. For example, as illustrated in FIG. 12, the voltage level of the direct current voltage VDC may be decreased in the middle of each frame period. In a case in which the direct current voltage input terminals 64 are provided on the vertical scanning end side on the liquid crystal panel 60 as illustrated in FIG. 5, the voltage drop of the direct current voltage VDC is larger on the vertical scanning start side than on the vertical scanning end side. Accordingly, also in a case in which the voltage level of the direct current voltage VDC is changed as illustrated in FIG. 12, variation in the magnitude of the scanning voltage among the gate bus lines GL is reduced, and the unevenness in display is suppressed from occurring.

1.5.2 Second Modified Example

Figure 13:
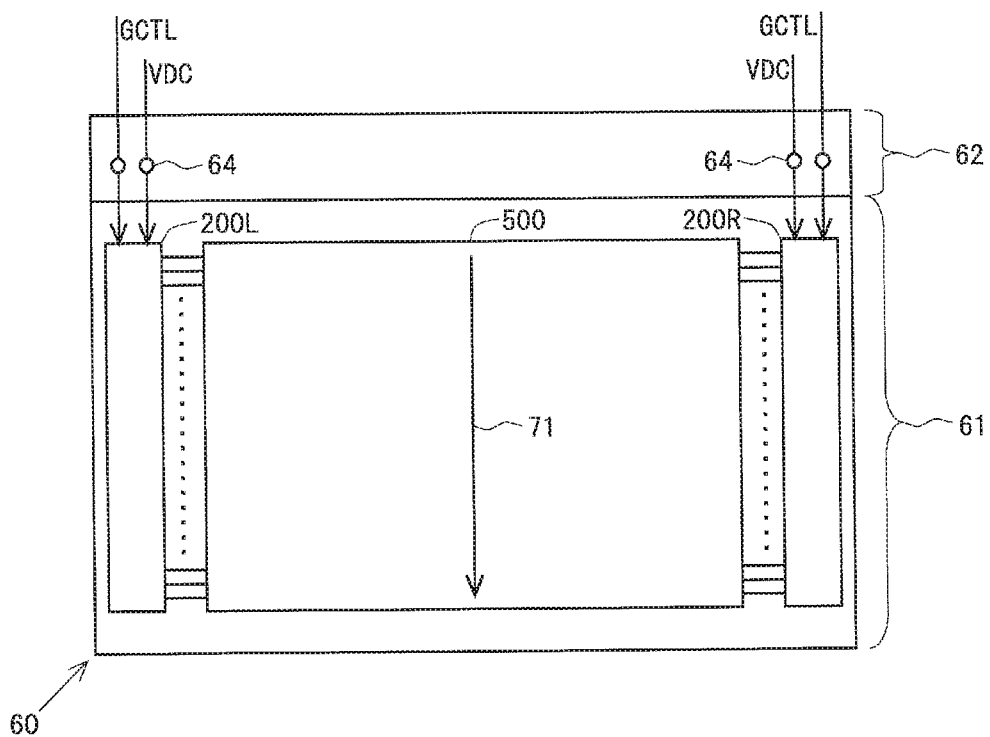
FIG. 13 is a diagram for explaining a relationship between positions of direct current voltage input terminals and a vertical scanning direction in a second modified example of the first embodiment.
Figure 14:
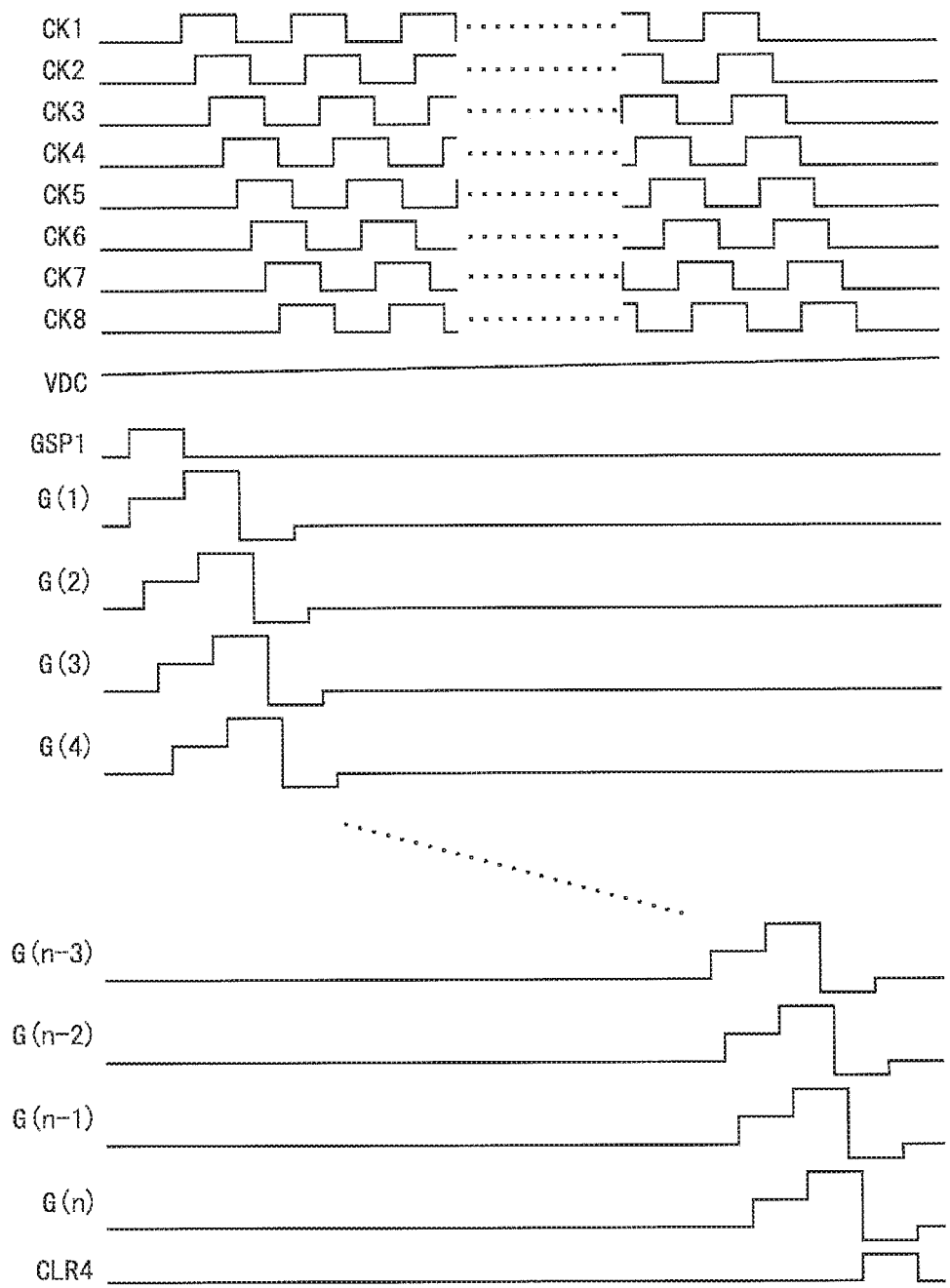
FIG. 14 is a timing chart for explaining a change of the voltage level of the direct current voltage in the second modified example of the first embodiment.

In the first embodiment, the direct current voltage input terminals 64 are provided on the vertical scanning end side on the liquid crystal panel 60 (see FIG. 5). However, the present invention is not limited to this. The configuration may be such that, as illustrated in FIG. 13, the picture-frame region 62 is provided above the active region 61 and the direct current voltage input terminals 64 are provided on the vertical scanning start side on the liquid crystal panel 60. In this case, the voltage drop of the direct current voltage VDC is larger on the vertical scanning end side than on the vertical scanning start side. Hence, in the present modified example, the direct current voltage generation circuit 400 gradually raises the voltage level of the direct current voltage VDC in each frame period as illustrated in FIG. 14. As a result, as in the first embodiment, variation in the magnitude of the scanning voltage among the gate bus lines GL can be reduced, and the unevenness in display is suppressed from occurring.

Figure 15:
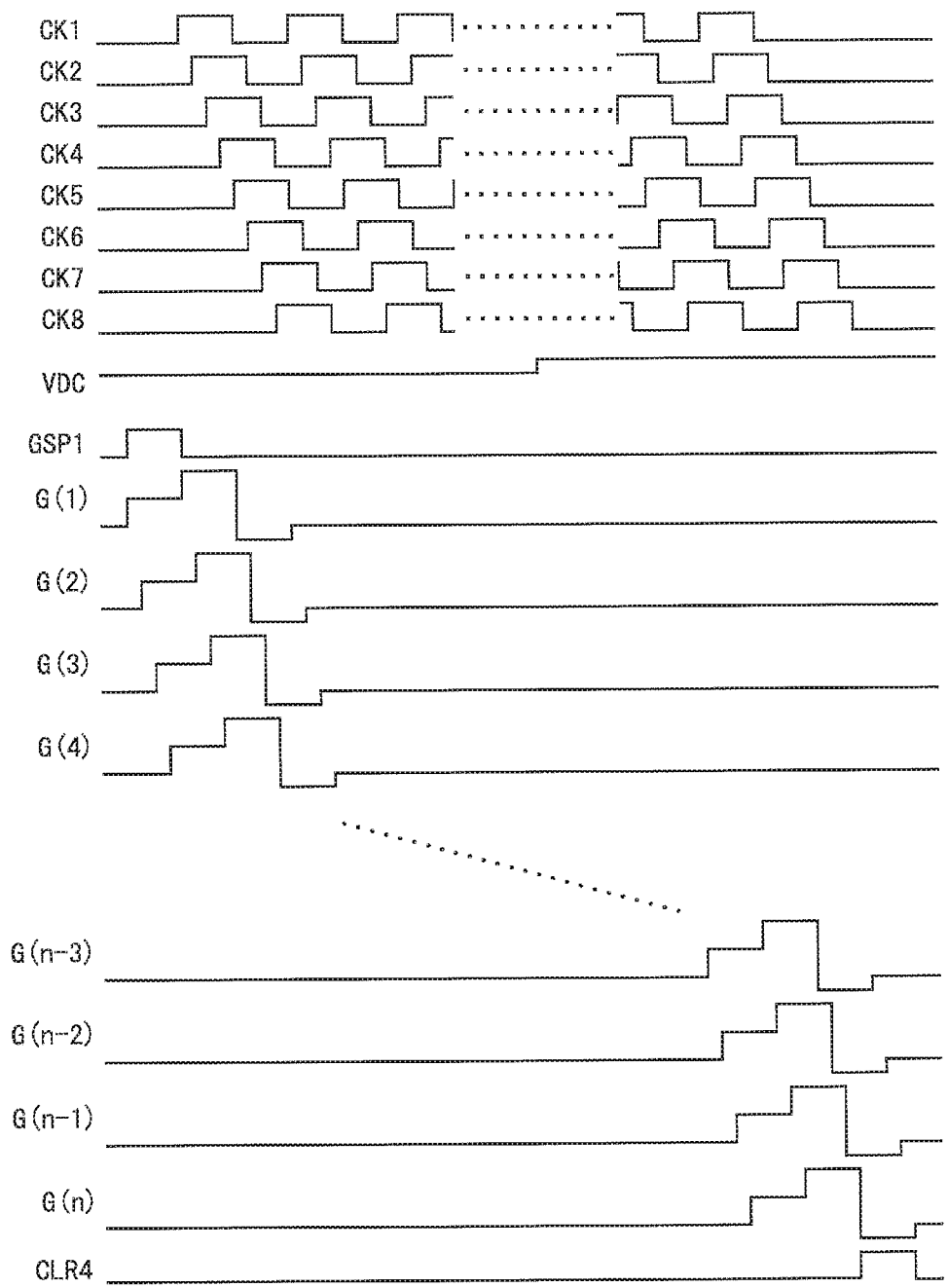
FIG. 15 is a timing chart for explaining a change of the voltage level of the direct current voltage in the second modified example of the first embodiment.

For a similar purpose to that of the first modified example, the direct current voltage generation circuit 400 may raise the voltage level of the direct current voltage VDC step by step in each frame period. For example, as illustrated in FIG. 15, the voltage level of the direct current voltage VDC may be raised in the middle of each frame period.

1.5.3 Third Modified Example

Figure 16:
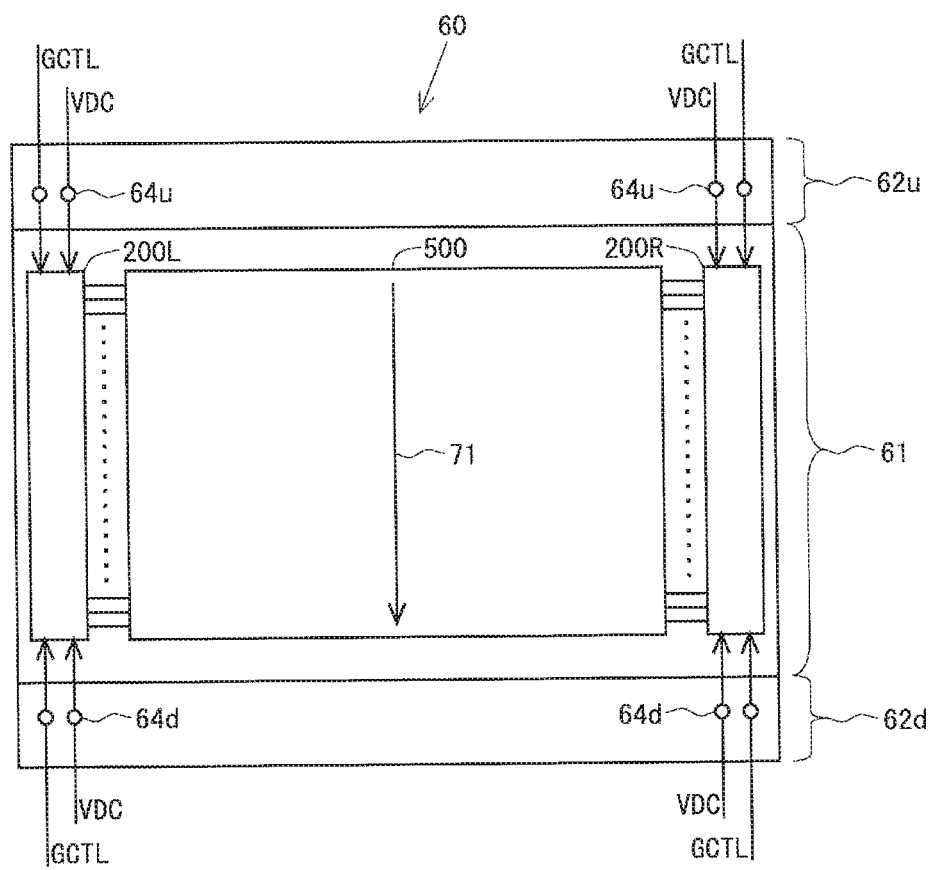
FIG. 16 is a diagram for explaining a relationship between positions of the direct current voltage input terminals and a vertical scanning direction in a third modified example of the first embodiment.
Figure 17:
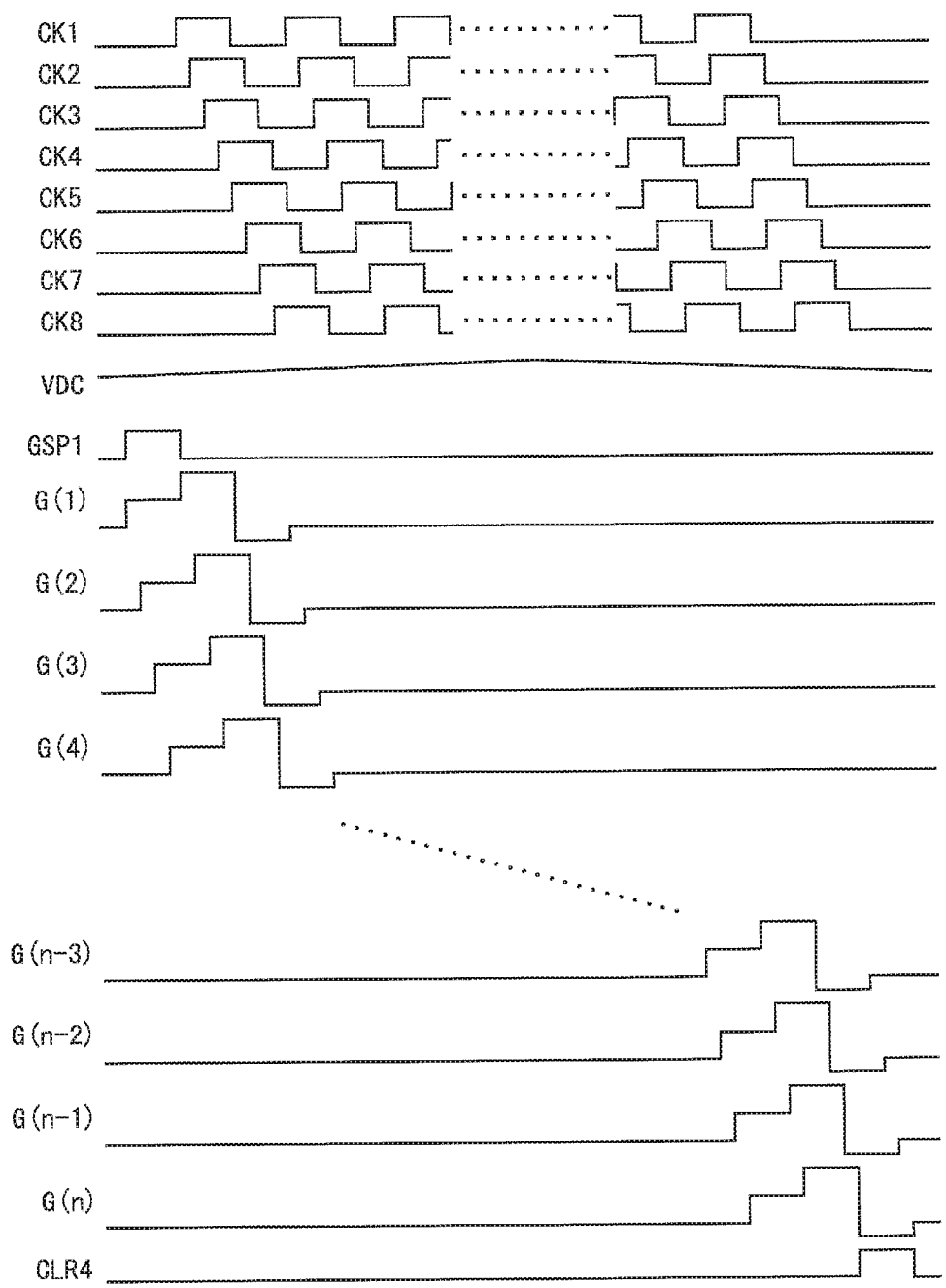
FIG. 17 is a timing chart for explaining a change of the voltage level of the direct current voltage in the third modified example of the first embodiment.

FIG. 16 is a diagram for explaining a relationship between positions of direct current voltage input terminals and the vertical scanning direction in the present modified example. In the present modified example, as illustrated in FIG. 16, a picture-frame region 62u is provided above the active region 61, and a picture-frame region 62d is provided below the active region 61. Then, direct current voltage input terminals 64u are provided on the vertical scanning start side on the liquid crystal panel 60, and direct current voltage input terminals 64d are provided on the vertical scanning end side on the liquid crystal panel 60. That is, the direct current voltage VDC is inputted to the gate drivers 200L and 200R from both of the vertical scanning start side and the vertical scanning end side. According to the present modified example, the voltage drop of the direct current voltage VDC is smallest on the vertical scanning start side and the vertical scanning end side, and is largest around the center. Hence, in the present modified example, the direct current voltage generation circuit 400 changes the voltage level of the direct current voltage VDC in each frame period as illustrated in FIG. 17. That is, a voltage level of the direct current voltage VDC at each of the direct current voltage input terminals 64u and 64d is highest at the time of driving the gate bus line GL around the center and is lowest at the time of driving the first-row gate bus line GL(1) and driving the n-th-row gate bus line GL(n). Also in the present modified example, variation in the magnitude of the scanning voltage among the gate bus lines GL is reduced, and the unevenness in display is suppressed from occurring.

Figure 18:
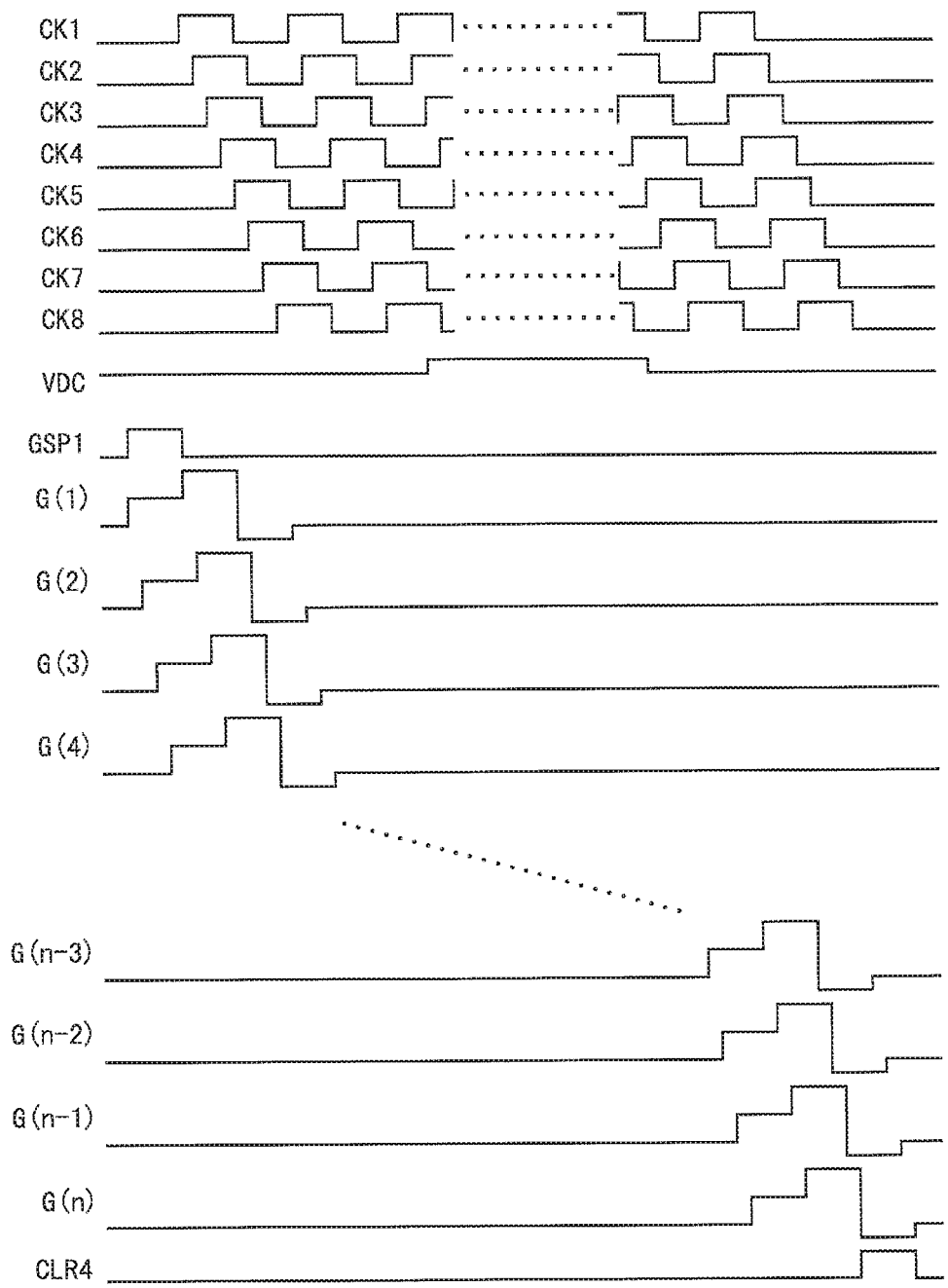
FIG. 18 is a timing chart for explaining a change of the voltage level of the direct current voltage in the third modified example of the first embodiment.

For a similar purpose to that of the first modified example, the direct current voltage generation circuit 400 may change the voltage level of the direct current voltage VDC step by step in each frame period. For example, as illustrated in FIG. 18, the voltage level of the direct current voltage VDC may be changed sometimes in each frame period.

1.5.4 Fourth Modified Example

Figure 19:
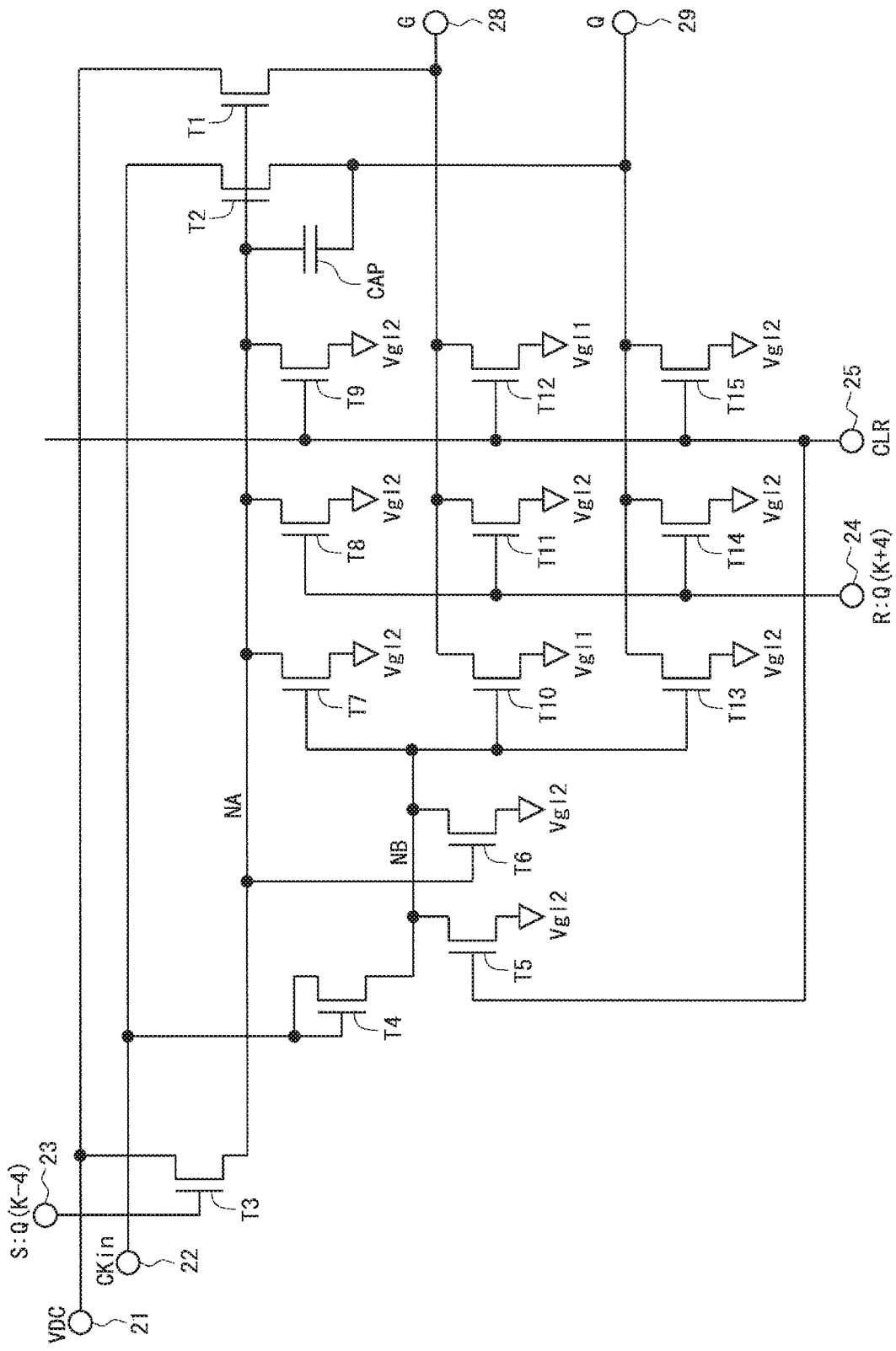
FIG. 19 is a circuit diagram illustrating a configuration of a unit circuit in a fourth modified example of the first embodiment.

FIG. 19 is a circuit diagram illustrating a configuration of a unit circuit 2 in the present modified example. In the first embodiment, the thin film transistor T3 composes the diode connection. In contrast, a thin film transistor T3 in the present modified example is connected at its gate terminal to the input terminal 23, connected at its drain terminal to the input terminal 21, and connected at its source terminal to the first node NA. That is, the drain terminal of the thin film transistor T3 is given the direct current voltage VDC. Also by such a configuration, each unit circuit 2 operates similarly to that in the first embodiment. Hence, also in the present modified example, variation in the magnitude of the scanning voltage among the gate bus lines GL is reduced, and the unevenness in display is suppressed from occurring.

Figure 20:
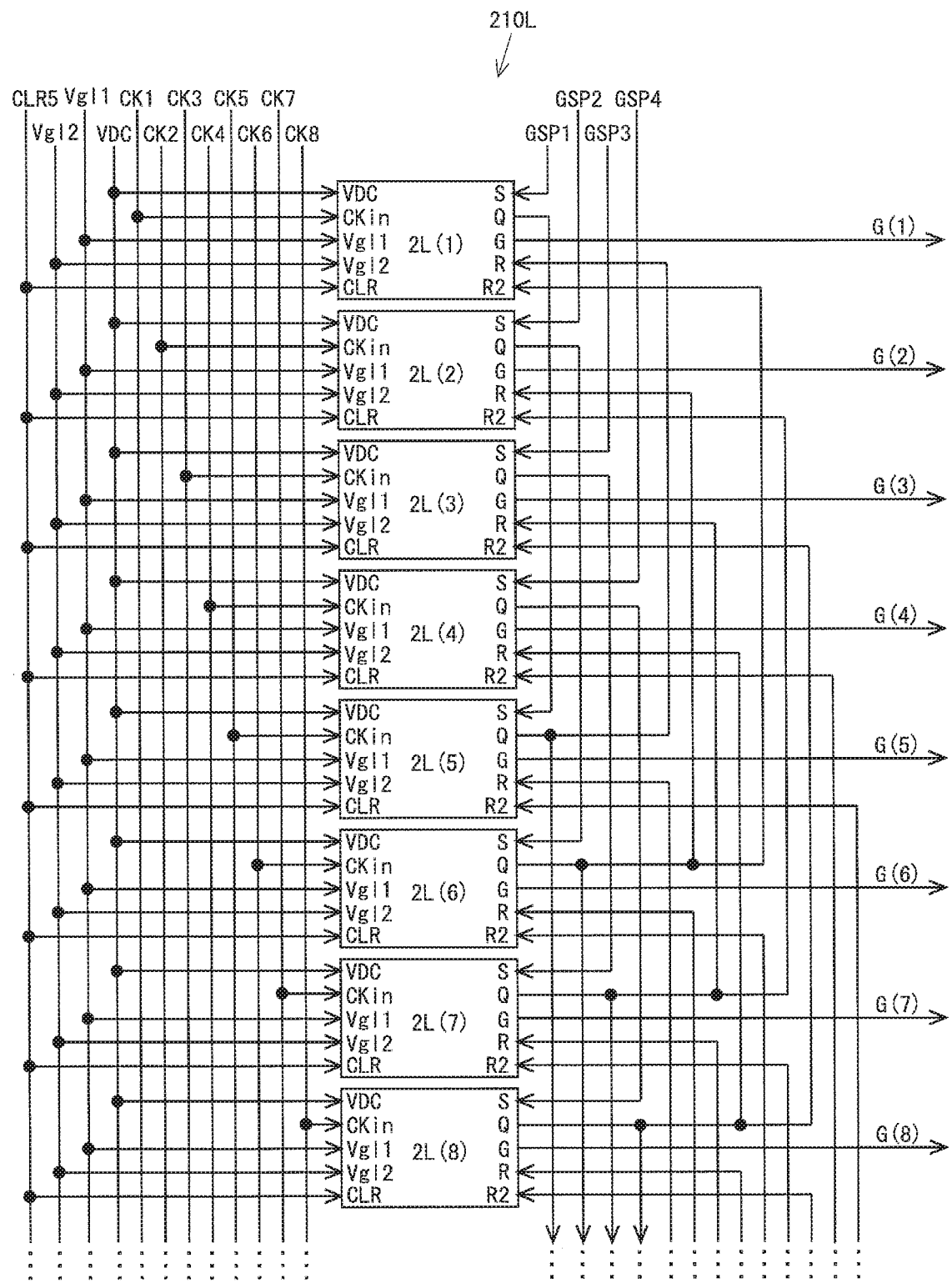
FIG. 20 is a block diagram illustrating a configuration of a shift register in a gate driver in a second embodiment.

2. Second Embodiment 2.1 Configuration of Gate Driver 2.1.1 Configuration of Shift Register FIG. 20 is a block diagram illustrating a configuration of a shift register 210L in a gate driver 200L in the present embodiment. Unlike the first embodiment, in the present embodiment, two types of reset signals R and R2 are inputted to each unit circuit 2L. Moreover, in the present embodiment, five clear signals CLR1 to CLR5 are used.

Assuming that k is an integer of 1 or more and (n−5) or less, a unit circuit 2L(k) at a k-th stage is given, as the reset signal R2, an output signal Q(k+5) outputted from a unit circuit 2L(k+5) at a (k+5)-th stage. A unit circuit 2L(n−4) at an (n−4)-th stage is given the clear signal CLR1 as the reset signal R2, a unit circuit 2L(n−3) at an (n−3)-th stage is given the clear signal CLR2 as the reset signal R2, a unit circuit 2L(n−2) at an (n−2)-th stage is given the clear signal CLR3 as the reset signal R2, a unit circuit 2L(n−1) at an (n−1)-th stage is given the clear signal CLR4 as the reset signal R2, and a unit circuit 2L(n) at an n-th stage is given the clear signal CLR5 as the reset signal R2. Note that, in the present embodiment, the clear signal CLR5 is given as a clear signal CLR commonly to all the unit circuits 2L(1) to 2L(n).

2.1.2 Configuration of Unit Circuit

Figure 21:
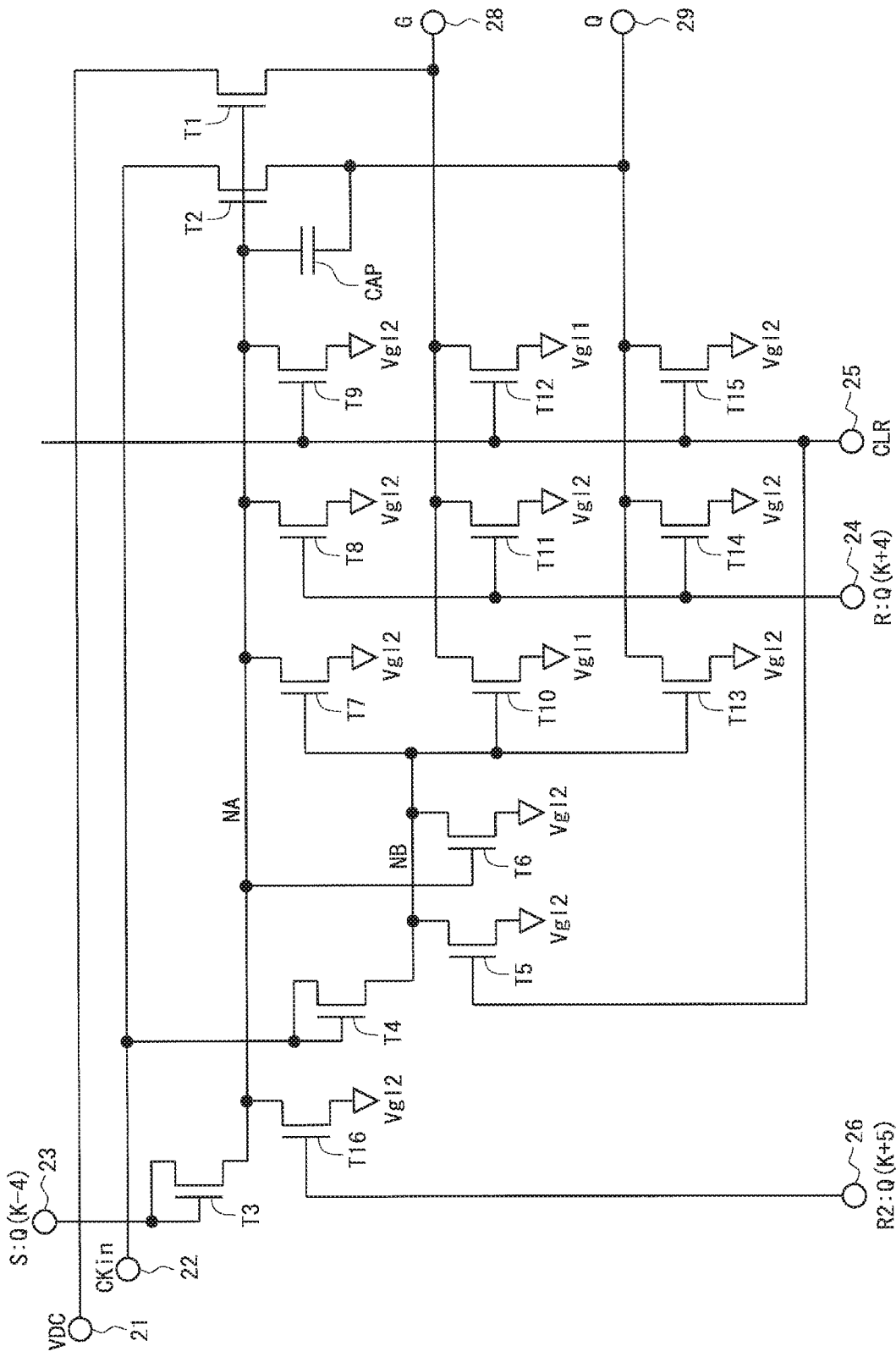
FIG. 21 is a circuit diagram illustrating a configuration of a unit circuit in the second embodiment.

FIG. 21 is a circuit diagram illustrating a configuration of the unit circuit 2 in the present embodiment. In the present embodiment, the unit circuit 2 is provided with a thin film transistor T16 and an input terminal 26 that receives the reset signal R2 in addition to the constituents in the first embodiment. This thin film transistor T16 is connected at its gate terminal to the input terminal 26, connected at its drain terminal to the first node NA, and connected at its source terminal to the input terminal for the second gate low voltage Vgl2. The thin film transistor T16 changes the potential of the first node NA toward the second low level when the reset signal R2 is at the high level.

2.2 Driving Method

Figure 22:
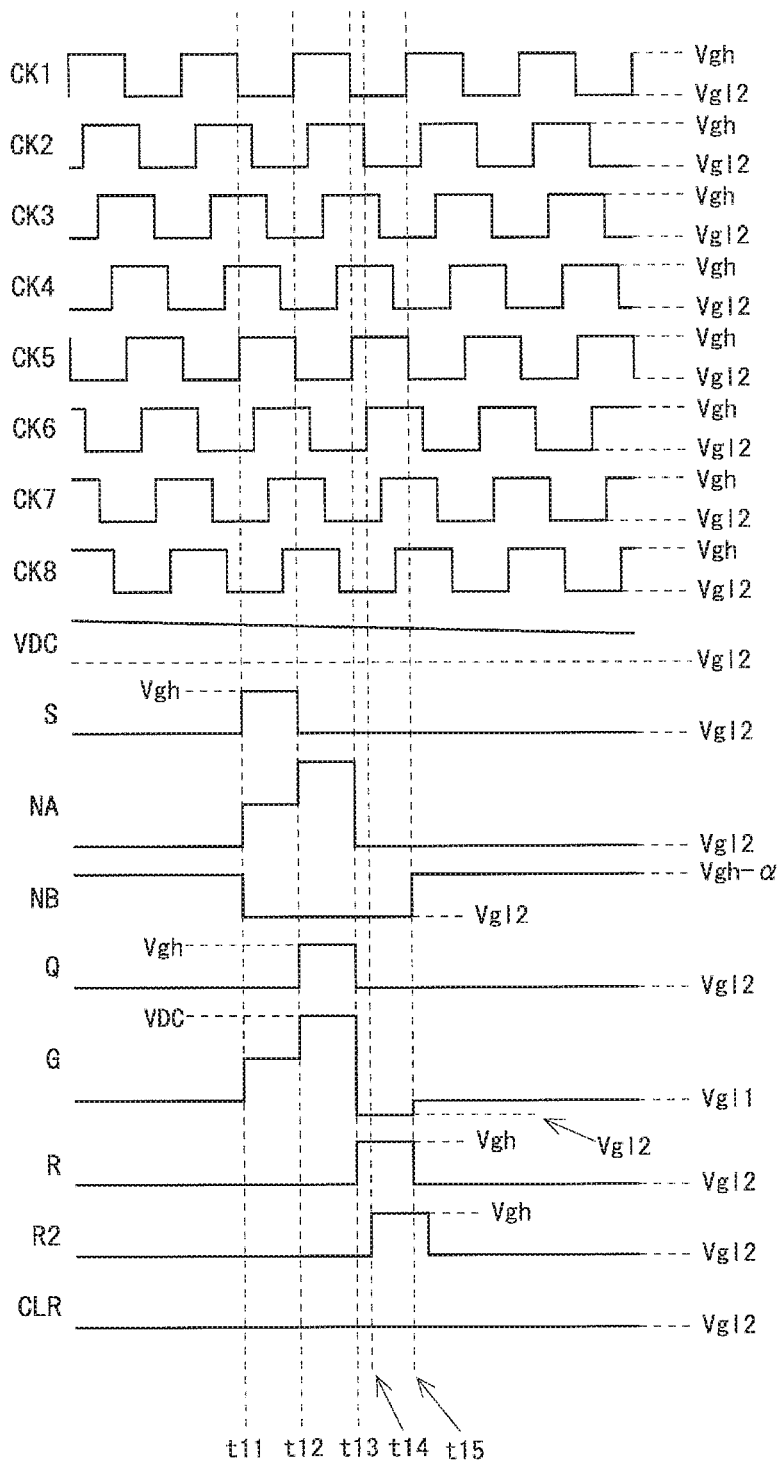
FIG. 22 is a timing chart for explaining operations of the unit circuit in the second embodiment.

With reference to FIG. 22, a description will be given of the operation of the unit circuit 2 in the present embodiment. In a period before time point t13, a similar operation to that in the period before time point t03 (see FIG. 8) in the first embodiment is performed. When time point t14 comes, the reset signal R2 changes from the second low level to the high level. Thereby, the thin film transistor T16 turns to the ON state. By the thin film transistor T16 turning to the ON state, the potential of the first node NA is pulled to the second low level. In a period after time point t15, a similar operation to that in the period after time point t04 (see FIG. 8) in the first embodiment is performed. Note that the voltage level of the direct current voltage VDC at each direct current voltage input terminal 64 gradually decreases in each frame period as in the first embodiment.

2.3 Effect

Also in the present embodiment, the voltage level of the direct current voltage VDC at each direct current voltage input terminal 64 gradually decreases in each frame period. Therefore, as in the first embodiment, variation in the magnitude of the scanning voltage among the gate bus lines GL is reduced, and the unevenness in display is suppressed from occurring. Moreover, according to the present embodiment, two reset signals R and R2 are used, whereby, at the time of dropping the gate output, the potential of the first node NA in the unit circuit 2 decreases rapidly regardless of the mixing of noise, or the like. As a result, the potentials of the output signal G and the output signal Q also decrease rapidly, and a display defect is suppressed from occurring.

2.4 Modified Example

Figure 23:
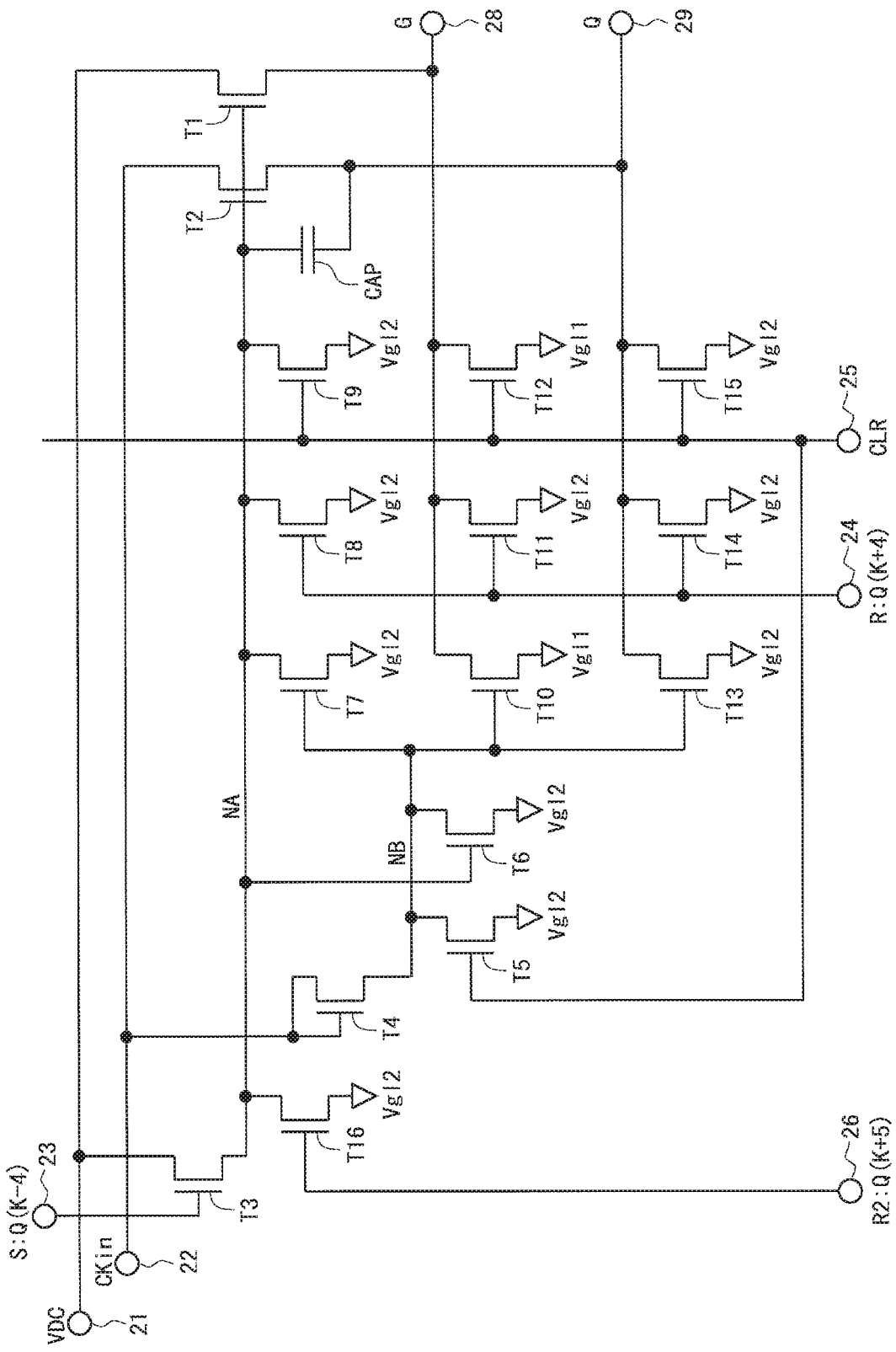
FIG. 23 is a circuit diagram illustrating a configuration of a unit circuit in a modified example of the second embodiment.

FIG. 23 is a circuit diagram illustrating a configuration of a unit circuit 2 in the present modified example. In the present modified example, a configuration of the thin film transistor T3 is similar to that of the fourth modified example of the first embodiment (see FIG. 19). That is, the drain terminal of the thin film transistor T3 is given the direct current voltage VDC. Also by such a configuration, each unit circuit 2 operates similarly to that in the second embodiment. Hence, also in the present modified example, variation in the magnitude of the scanning voltage among the gate bus lines GL is reduced, and the unevenness in display is suppressed from occurring. Moreover, the potential of the first node NA decreases rapidly at the time of dropping the gate output, and accordingly, a display defect is suppressed from occurring.

Figure 24:
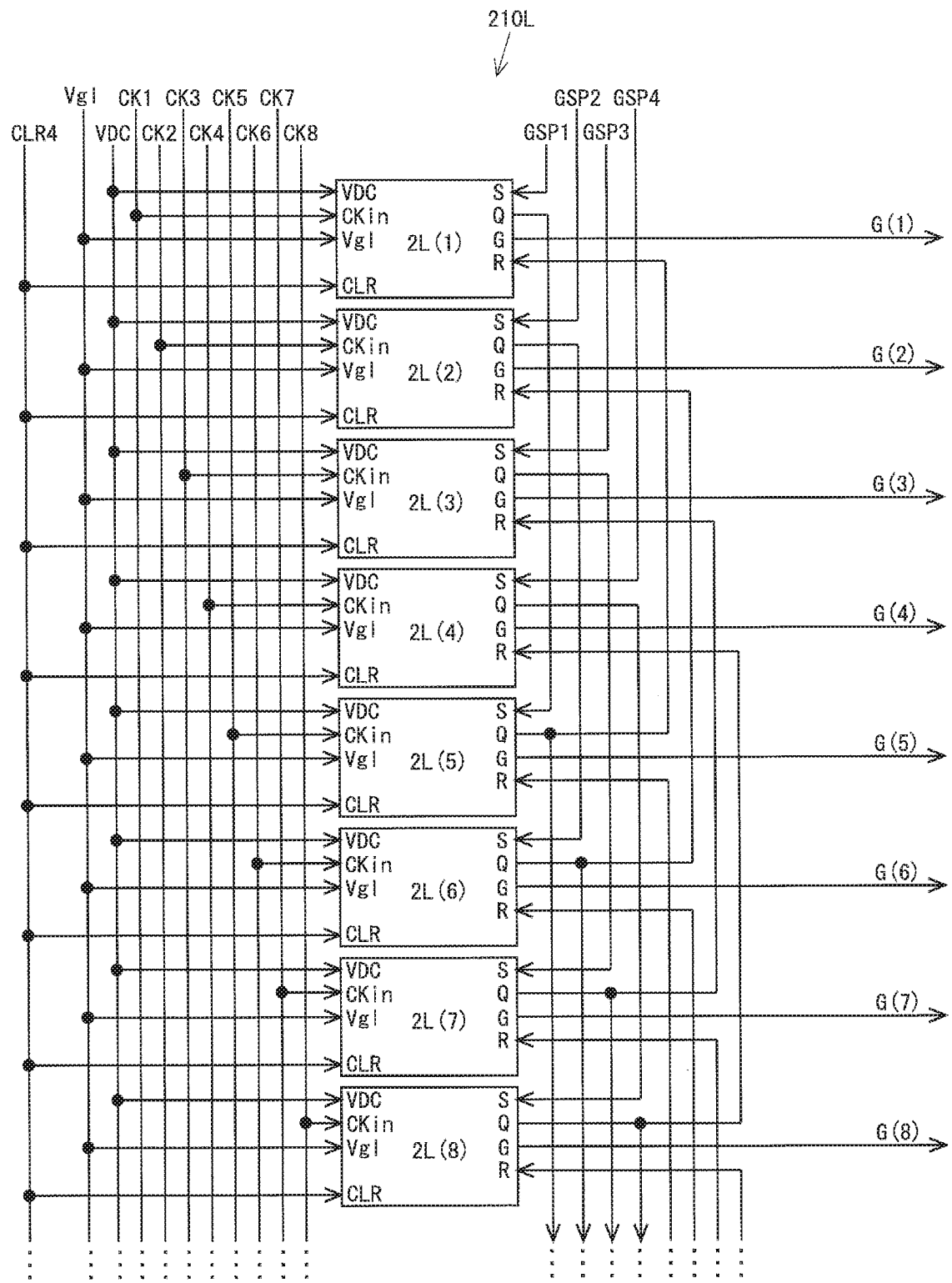
FIG. 24 is a block diagram illustrating a configuration of a shift register in a gate driver in a third embodiment.

3. Third Embodiment 3.1 Configuration of Gate Driver 3.1.1 Configuration of Shift Register FIG. 24 is a block diagram illustrating a configuration of a shift register 210L in a gate driver 200L in the present embodiment. Unlike the first embodiment, in the present embodiment, one type of gate low voltage Vgl is used as the low-level direct current power supply voltage. This gate low voltage Vgl is given commonly to all the unit circuits 2L(1) to 2L(n). Hereinafter, the voltage level of the gate low voltage Vgl will be simply referred to as a "low level".

3.1.2 Configuration of Unit Circuit

Figure 25:
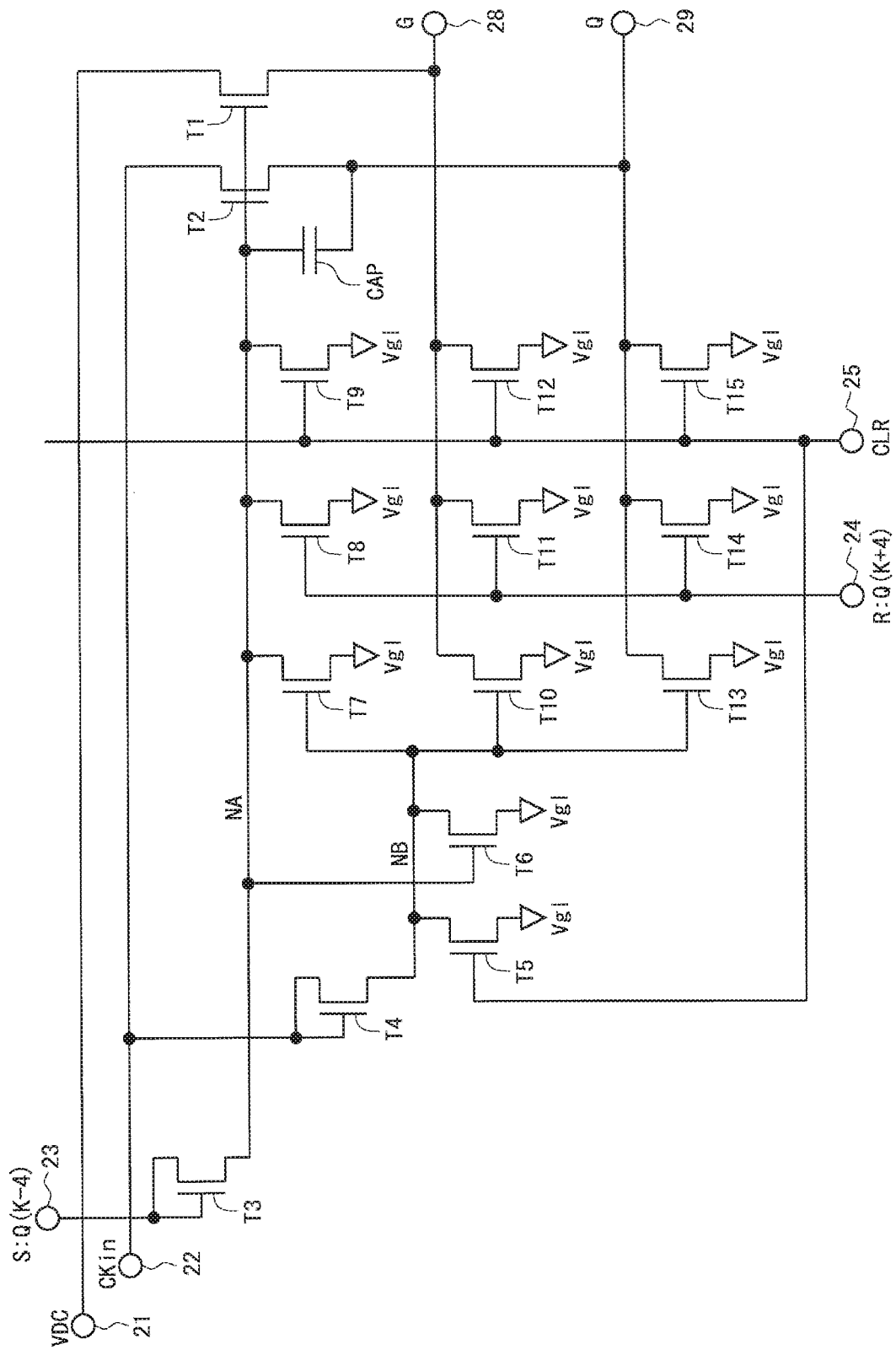
FIG. 25 is a circuit diagram illustrating a configuration of a unit circuit in the third embodiment.

FIG. 25 is a circuit diagram illustrating a configuration of a unit circuit 2 in the present embodiment. Constituents provided in the unit circuit 2 are similar to those of the first embodiment (see FIG. 7). However, the source terminals of the thin film transistors T5 to T15 are connected to an input terminal for the gate low voltage Vgl.

3.2 Driving Method

Figure 26:
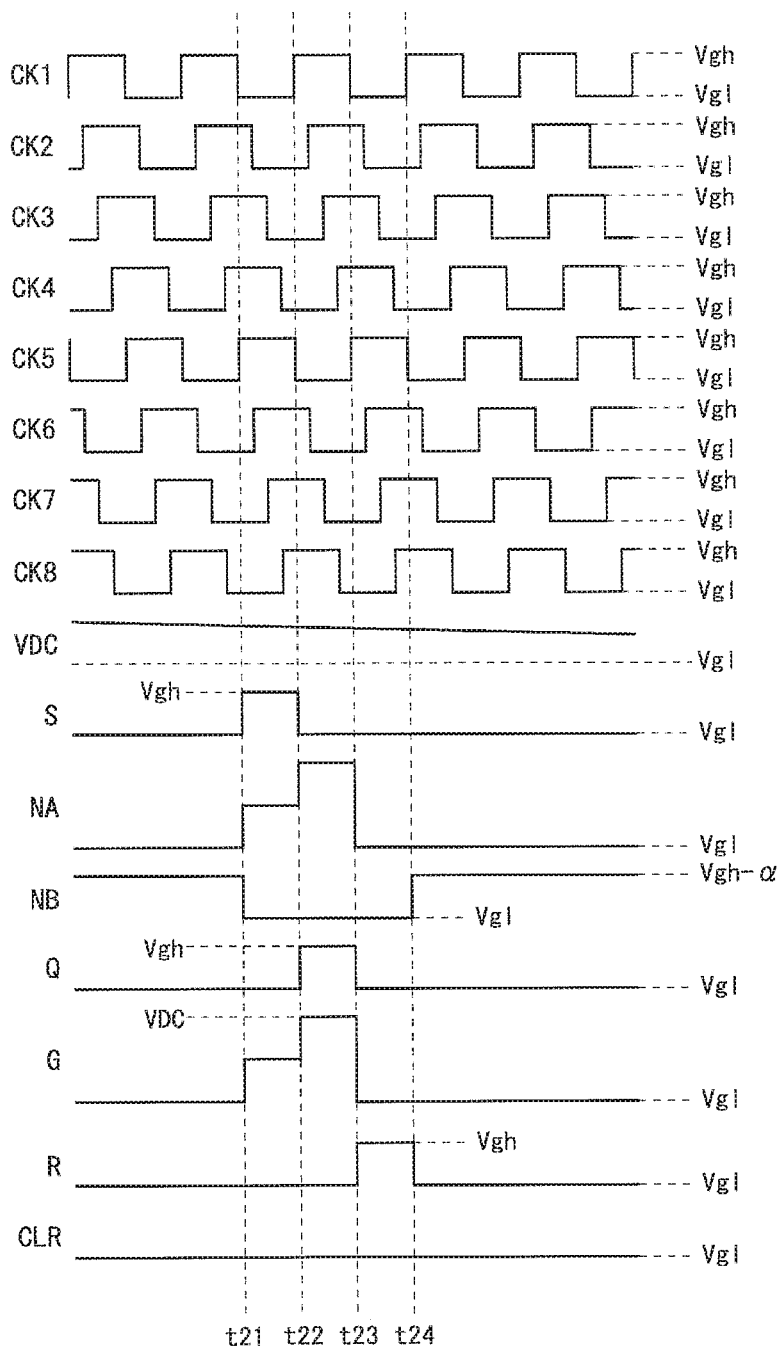
FIG. 26 is a timing chart for explaining operations of the unit circuit in the third embodiment.

With reference to FIG. 26, a description will be given of an operation of the unit circuit 2 in the present embodiment. In a period immediately before time point t23, a similar operation to that in the period immediately before time point t03 (see FIG. 8) in the first embodiment is performed. However, instead of the voltage level of the second gate low voltage Vgl2 in the first embodiment, the voltage level of the gate low voltage Vgl appears in the present embodiment.

When time point t23 comes, the reset signal R changes from the low level to the high level. Thereby, the thin film transistors T8, T11 and 114 turn to the ON state. By the thin film transistor T8 turning to the ON state, the potential of the first node NA turns to the low level, by the thin film transistor T11 turning to the ON state, the output signal G turns to the low level, and by the thin film transistor 114 turning to the ON state, the output signal Q turns to the low level.

When time point t24 comes, the input clock signal CKin changes from the low level to the high level. Thereby, the potential of the second node NB turns to the high level through the thin film transistor T4, and the thin film transistors T7, T10 and T13 turn to the ON state. By the thin film transistor T7 turning to the ON state, the potential of the first node NA is pulled to the low level, by the thin film transistor T10 turning to the ON state, the output signal G is pulled to the low level, and by the thin film transistor T13 turning to the ON state, the output signal Q is turned to the low level.

Figure 27:
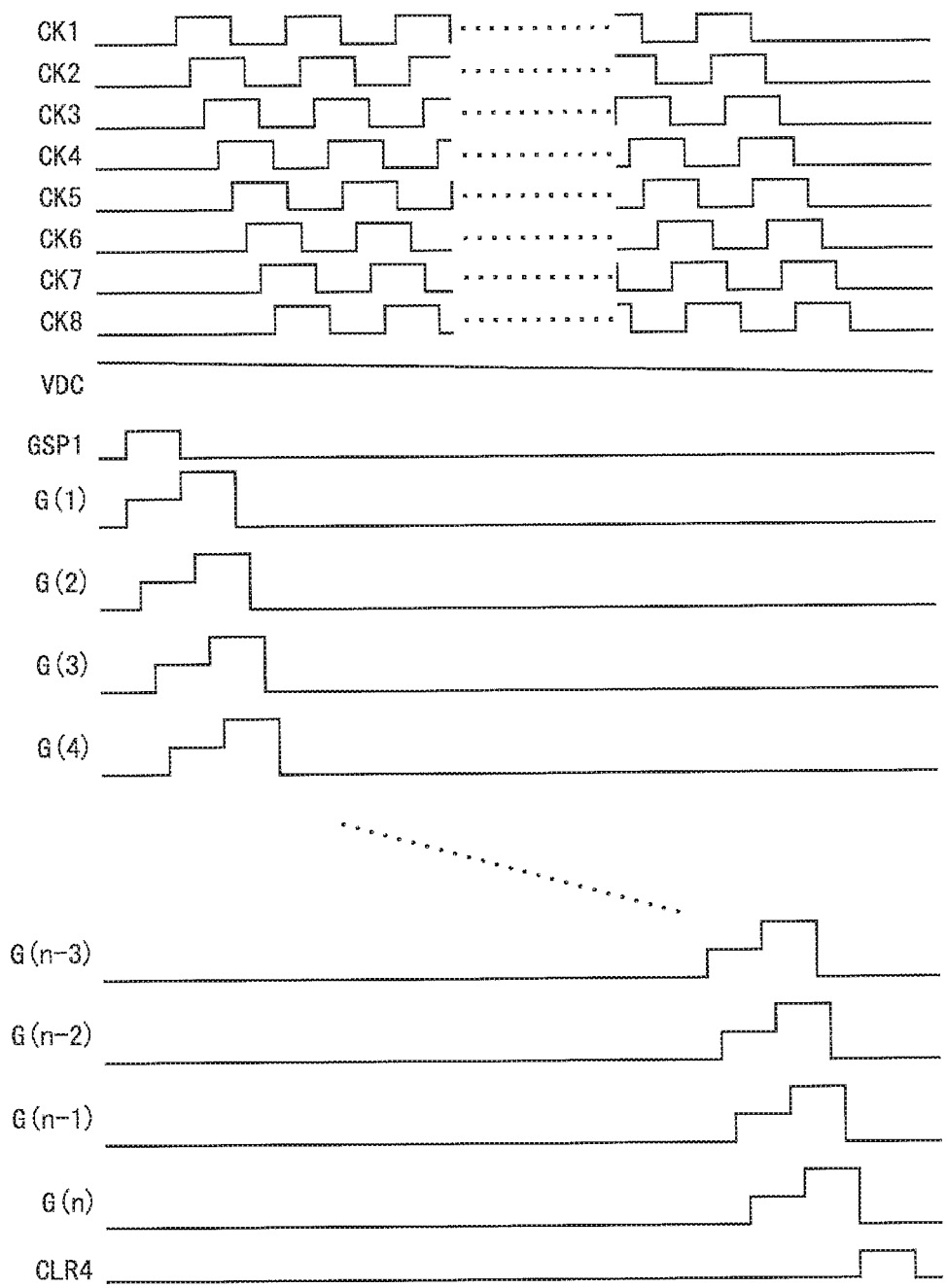
FIG. 27 is a timing chart for explaining a change of the voltage level of the direct current voltage in the third embodiment.

As illustrated in FIG. 27, the voltage level of the direct current voltage VDC at each direct current voltage input terminal 64 gradually decreases in each frame period as in the first embodiment.

3.3 Effect

Also in the present embodiment, the voltage level of the direct current voltage VDC at each direct current voltage input terminal 64 gradually decreases in each frame period. Therefore, as in the first embodiment, variation in the magnitude of the scanning voltage among the gate bus lines GL is reduced, and the unevenness in display is suppressed from occurring.

3.4 Modified Example 3.4.1 First Modified Example

Figure 28:
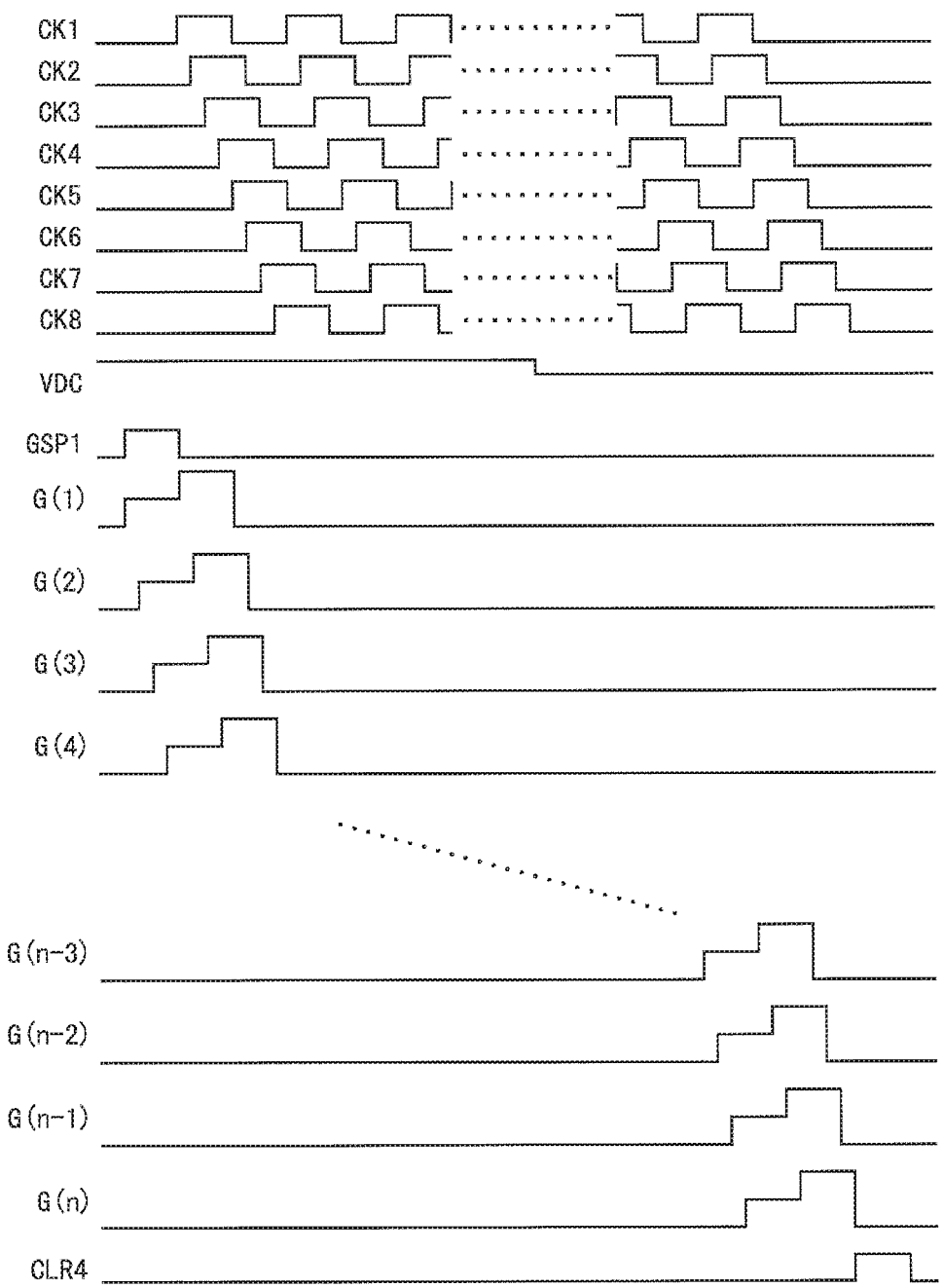
FIG. 28 is a timing chart for explaining a change of the voltage level of the direct current voltage in a first modified example of the third embodiment.

In the third embodiment, the direct current voltage generation circuit 400 gradually decreases the voltage level of the direct current voltage VDC in each frame period. However, the present invention is not limited to this. For a similar purpose to that of the first modified example of the first embodiment, the direct current voltage generation circuit 400 may decrease the voltage level of the direct current voltage VDC step by step in each frame period. For example, as illustrated in FIG. 28, the voltage level of the direct current voltage VDC may be decreased in the middle of each frame period.

3.4.2 Second Modified Example

Figure 29:
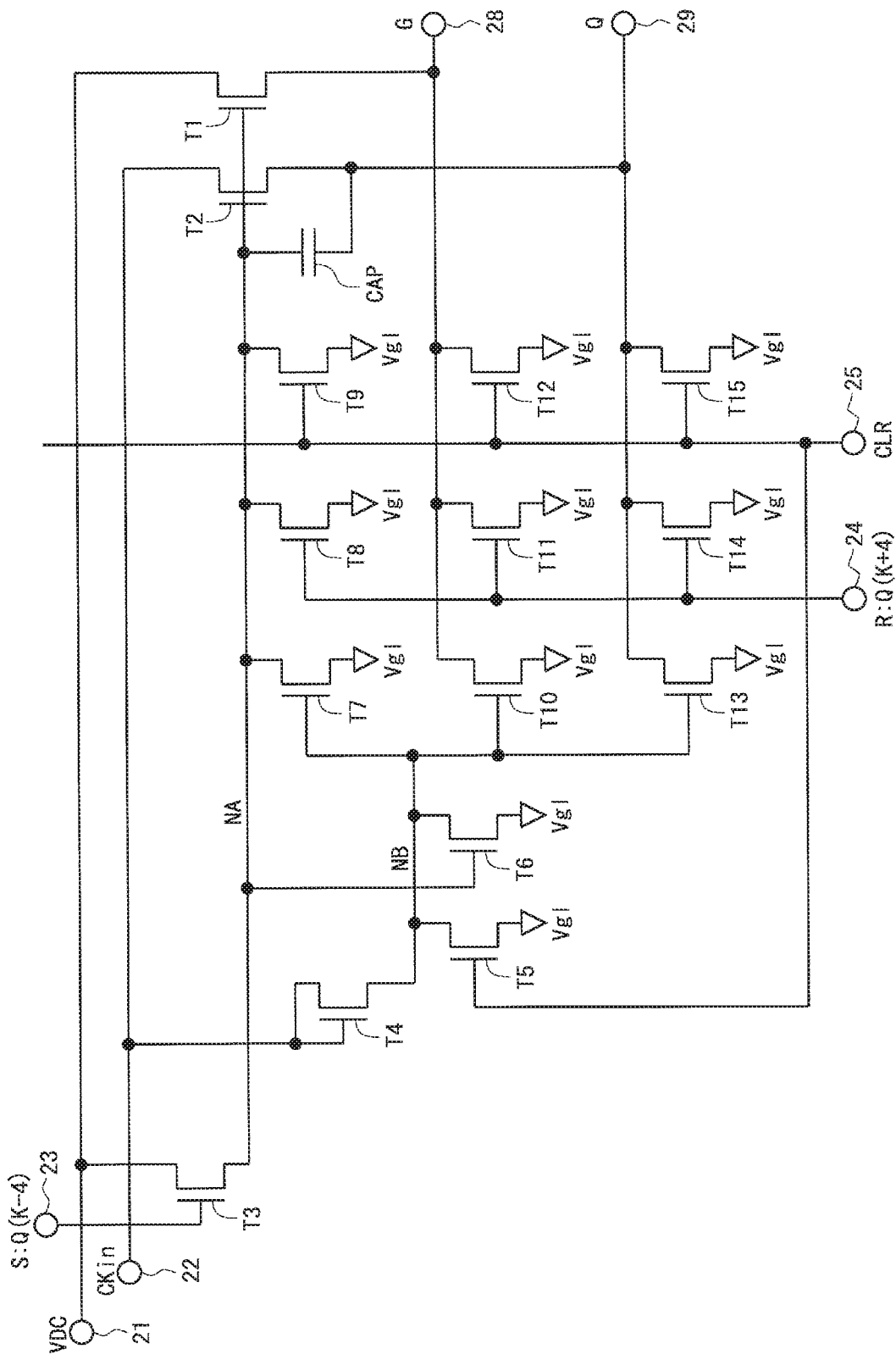
FIG. 29 is a circuit diagram illustrating a configuration of a unit circuit in a second modified example of the third embodiment.

FIG. 29 is a circuit diagram illustrating a configuration of a unit circuit 2 in the present modified example. In the present modified example, a configuration of the thin film transistor T3 is similar to that of the fourth modified example of the first embodiment (see FIG. 19). That is, the drain terminal of the thin film transistor T3 is given the direct current voltage VDC. Also by such a configuration, each unit circuit 2 operates similarly to that in the third embodiment. Hence, also in the present modified example, variation in the magnitude of the scanning voltage among the gate bus lines GL is reduced, and the unevenness in display is suppressed from occurring.

Figure 30:
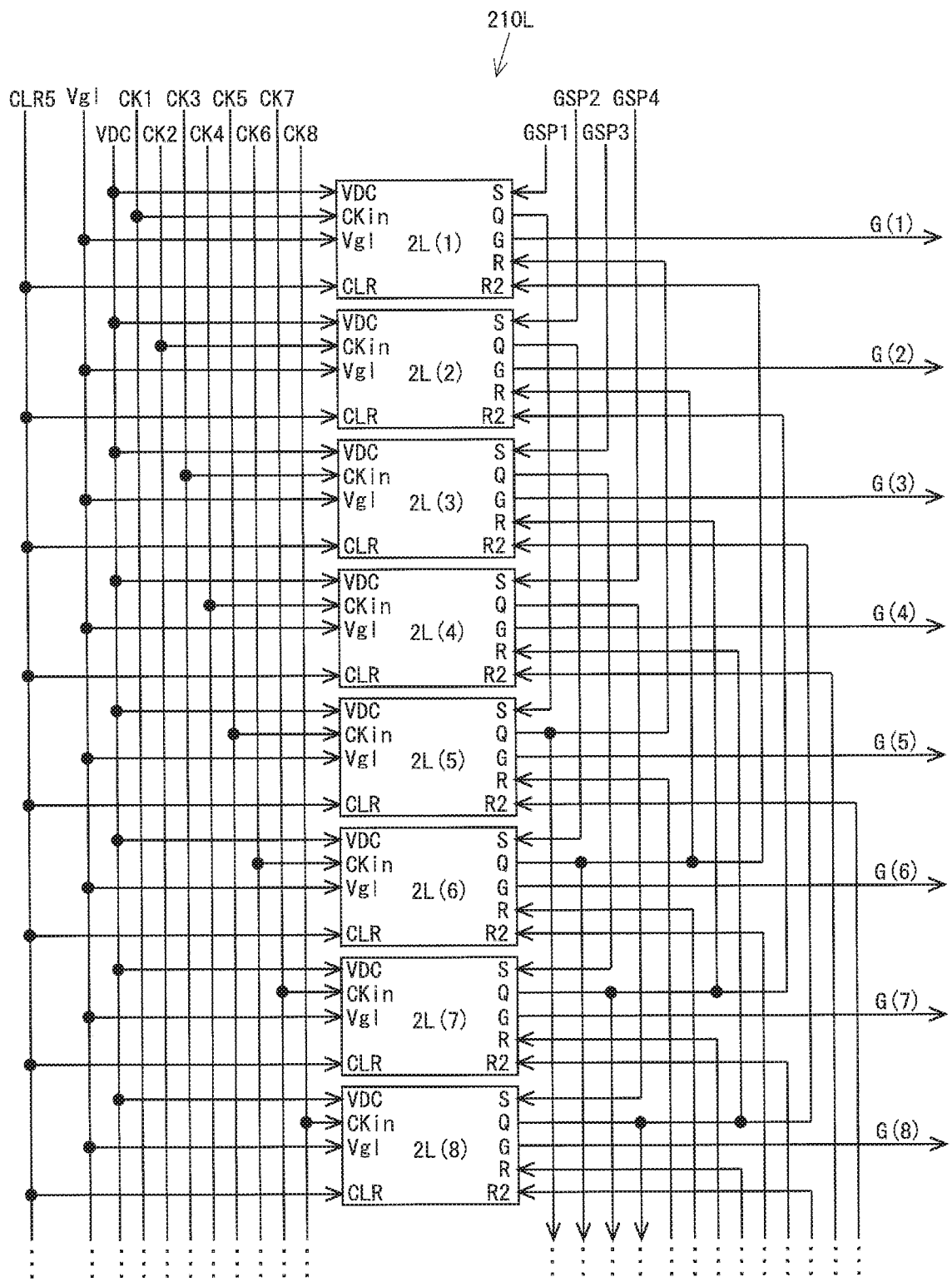
FIG. 30 is a block diagram illustrating a configuration of a shift register in a gate driver in a fourth embodiment.

4. Fourth Embodiment 4.1 Configuration of Gate Driver 4.1.1 Configuration of Shift Register FIG. 30 is a block diagram illustrating a configuration of a shift register 210L in the gate driver 200L in the present embodiment. As in the second embodiment, in the present embodiment, two types of reset signals R and R2 are inputted to each unit circuit 2L. Moreover, as in the third embodiment, one type of gate low voltage Vgl is used as the low-level direct current power supply voltage. The fourth embodiment is different from the first embodiment in these points.

4.1.2 Configuration of Unit Circuit

Figure 31:
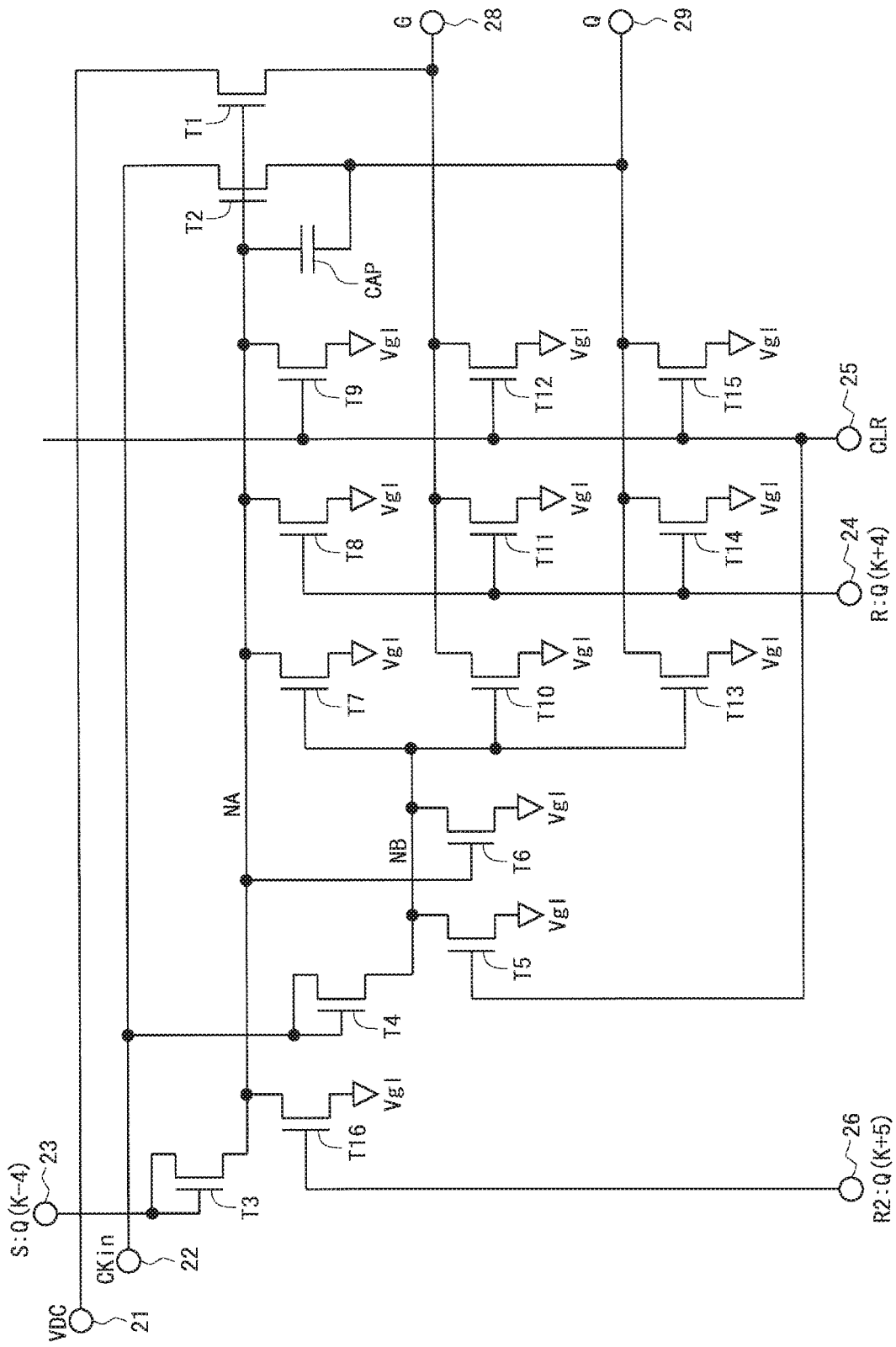
FIG. 31 is a circuit diagram illustrating a configuration of a unit circuit in the fourth embodiment.

FIG. 31 is a circuit diagram illustrating a configuration of a unit circuit 2 in the present embodiment. As in the second embodiment, the unit circuit 2 is provided with a thin film transistor T16 and an input terminal 26 that receives the reset signal R2 in addition to the constituents in the first embodiment. The thin film transistor T16 is connected at its gate terminal to the input terminal 26, connected at its drain terminal to the first node NA, and connected at its source terminal to the input terminal for the gate low voltage Vgl. The thin film transistor T16 changes the potential of the first node NA toward the low level when the reset signal R2 is at the high level. Moreover, in the present embodiment, the source terminals of the thin film transistors T5 to T15 are connected to the input terminal for the gate low voltage Vgl.

4.2 Driving Method

Figure 32:
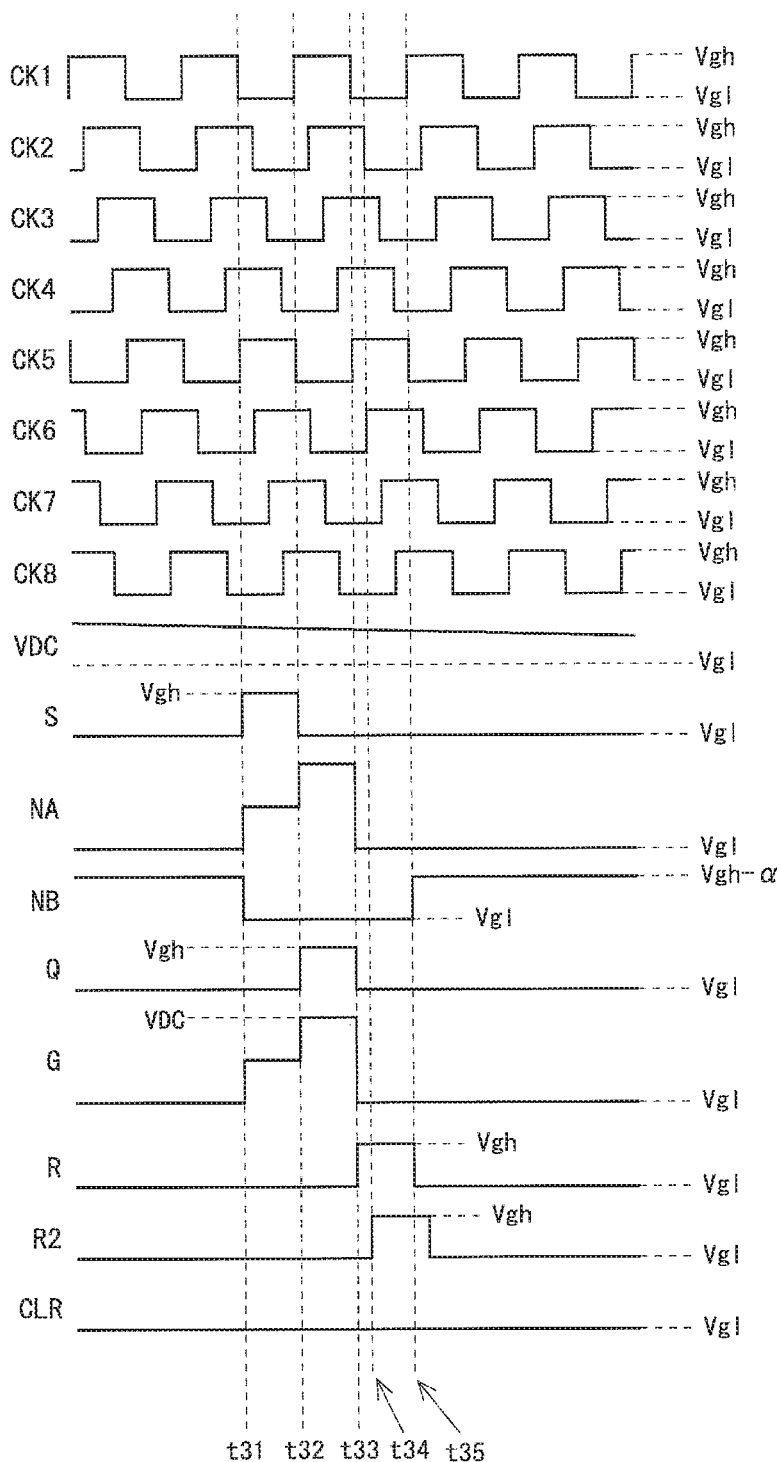
FIG. 32 is a timing chart for explaining operations of the unit circuit in the fourth embodiment.

With reference to FIG. 32, a description will be given of an operation of the unit circuit 2 in the present embodiment. In a period immediately before time point t33, a similar operation to that in the period immediately before time point t03 (see FIG. 8) in the first embodiment is performed. However, instead of the voltage level of the second gate low voltage Vgl2 in the first embodiment, the voltage level of the gate low voltage Vgl appears in the present embodiment.

When time point t33 comes, the reset signal R changes from the low level to the high level. Thereby, the thin film transistors T8, T11 and T14 turn to the ON state. By the thin film transistor T8 turning to the ON state, the potential of the first node NA turns to the low level, by the thin film transistor T11 turning to the ON state, the output signal G turns to the low level, and by the thin film transistor 114 turning to the ON state, the output signal Q turns to the low level.

When time point t34 comes, the reset signal R2 changes from the low level to the high level. Thereby, the thin film transistor T16 turns to the ON state. By the thin film transistor T16 turning to the ON state, the potential of the first node NA is pulled to the low level.

When time point t35 comes, the input clock signal CKin changes from the low level to the high level. Thereby, the potential of the second node NB turns to the high level through the thin film transistor T4, and the thin film transistors T7, T10 and T13 turn to the ON state. By the thin film transistor T7 turning to the ON state, the potential of the first node NA is pulled to the low level, by the thin film transistor T10 turning to the ON state, the output signal G is pulled to the low level, and by the thin film transistor T13 turning to the ON state, the output signal Q is pulled to the low level.

Note that the voltage level of the direct current voltage VDC at each direct current voltage input terminal 64 gradually decreases in each frame period as in the first embodiment.

4.3 Effect

Also in the present embodiment, the voltage level of the direct current voltage VDC at each direct current voltage input terminal 64 gradually decreases in each frame period. Therefore, as in the first embodiment, variation in the magnitude of the scanning voltage among the gate bus lines GL is reduced, and the unevenness in display is suppressed from occurring. Moreover, as in the second embodiment, the potential of the first node NA decreases rapidly at the time of dropping the gate output, and accordingly, a display defect is suppressed from occurring.

4.4 Modified Example

Figure 33:
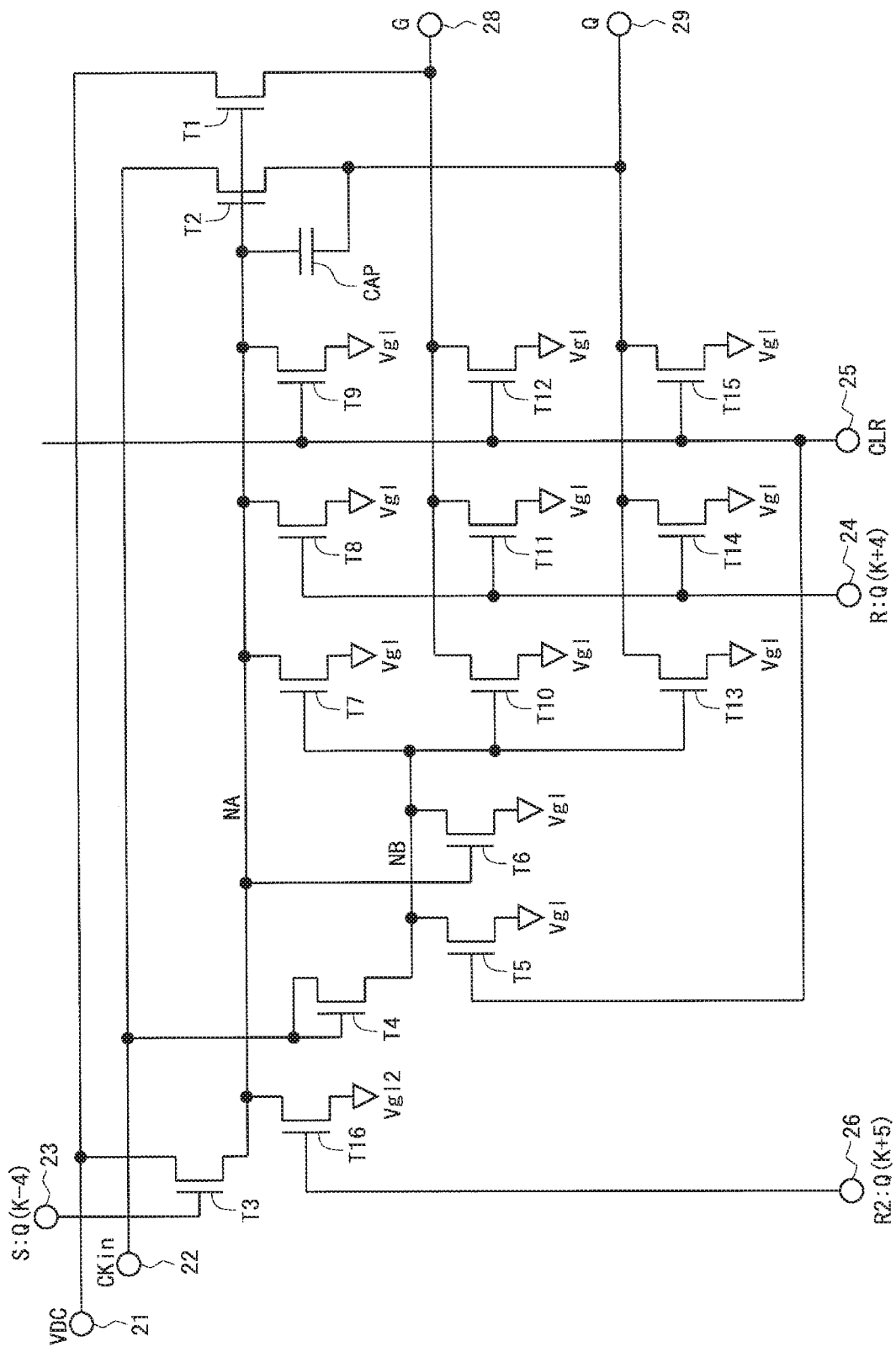
FIG. 33 is a circuit diagram illustrating a configuration of a unit circuit in a modified example of the fourth embodiment.

FIG. 33 is a circuit diagram illustrating a configuration of a unit circuit 2 in the present modified example. In the present modified example, a configuration of the thin film transistor T3 is similar to that of the fourth modified example of the first embodiment (see FIG. 19). That is, the drain terminal of the thin film transistor T3 is given the direct current voltage VDC. Also by such a configuration, each unit circuit 2 operates similarly to that in the fourth embodiment. Hence, also in the present modified example, variation in the magnitude of the scanning voltage among the gate bus lines GL is reduced, and the unevenness in display is suppressed from occurring. Moreover, the potential of the first node NA decreases rapidly at the time of dropping the gate output, and accordingly, a display defect is suppressed from occurring.

5. Others

Each of the embodiments is described by taking an example of using the n-channel thin film transistors for the thin film transistors in the unit circuit 2; however, the present invention is not limited to this. The present invention can also be applied to a case of using p-channel thin film transistors for the thin film transistors in the unit circuit 2.

Moreover, each of the embodiments is described by taking the liquid crystal display device as an example; however, the present invention is not limited to this. The present invention can also be applied to display devices other than the liquid crystal display device, the other display devices including an organic electro luminescence (EL) display device.

Moreover, each of the embodiments is described by taking as an example the case where there is adopted the system (both-side input drive system) of driving the respective gate bus lines GL from both of one end side and other end side of the display unit 500 (see FIG. 4). With regard to this, in a display device for a middle-sized laptop computer, a large-sized television set, or the like, it is preferable to adopt the both-side input drive system since the wiring resistance and capacitance of the gate bus lines GL are large. However, the present invention can also be applied to a case where the both-side input drive system as described above is not adopted. For example, the present invention can also be applied to a case of driving all the gate bus lines GL from one end side of the display unit 500. Moreover, the present invention can also be applied to a case, for example, where a so-called comb driving system (interlace driving system) is adopted. The comb driving system is a driving system of, for example, driving the gate bus lines GL on odd-numbered rows from one end side of the display unit 500 and driving the gate bus lines GL on even-numbered rows from other end side of the display unit 500. The comb driving system is adopted, for example, in a display device provided with a middle-to-small-sized panel.

The present invention has been described above in detail; however, the above description is illustrative in all aspects and is not restrictive. It is understood that many other changes and modifications can be made without departing from the scope of the present invention.

What is claimed is:

1. A display device comprising:
a display panel including: a plurality of scanning signal lines each being connected to a plurality of pixel formation portions; and a scanning signal line drive circuit configured to perform vertical scanning by sequentially turning the plurality of scanning signal lines to a selected state in each frame period; and
a direct current voltage generation circuit configured to generate a direct current voltage for turning the scanning signal lines to the selected state,
wherein
the display panel includes a direct current voltage input terminal configured to receive the direct current voltage generated by the direct current voltage generation circuit,
the scanning signal line drive circuit includes a shift register composed of a plurality of unit circuits provided to correspond to the plurality of scanning signal lines, the shift register being configured to perform a shift operation based on a plurality of clock signals,
each unit circuit includes:
    a first output node configured to output a scanning signal to a corresponding scanning signal line;
    a second output node configured to output a control signal for controlling operations of another unit circuit;
    a first node configured to change from an OFF level to an ON level based on a control signal outputted from a second output node of another unit circuit;
    a first output control transistor including a control terminal connected to the first node, a first conductive terminal connected to the direct current voltage input terminal, and a second conductive terminal connected to the first output node;
    a second output control transistor including a control terminal connected to the first node, a first conductive terminal given a corresponding clock signal, and a second conductive terminal connected to the second output node;
    a second node configured to change from an OFF level to an ON level based on a corresponding clock signal;
    a second node turn-off transistor including a control terminal connected to the first node, a first conductive terminal connected to the second node, and a second conductive terminal given a potential of the OFF level;
    a first first-output-node turn-off transistor including a control terminal connected to the second node, a first conductive terminal connected to the first output node, and a second conductive terminal given a potential of turning a scanning signal line to a non-selected state; and
    a second first-output-node turn-off transistor including a control terminal connected to a second output node of an another unit circuit a first conductive terminal connected to the first output node, and a second conductive terminal given a potential of turning a scanning signal line to a non-selected state,
the direct current voltage generation circuit changes a voltage level of the direct current voltage in each frame period,
the potential given to the second conductive terminal of the first first-output-node turn-off transistor and the potential given to the second conductive terminal of the second first-output-node turn-off transistor are different from each other,
the first first-output-node turn-off transistor and the second first-output-node turn-off transistor are n-channel transistors, and
the potential given to the second conductive terminal of the second first-output-node turn-off transistor is lower than the potential iven to the second conductive terminal of the first first-output-node turn-off transistor.

2. The display device according to claim 1, wherein the direct current voltage generation circuit sets a voltage level of the direct current voltage when a scanning signal line disposed at a most distant position from the direct current voltage input terminal is to be turned to the selected state higher than a voltage level of the direct current voltage when a scanning signal line disposed at a closest position from the direct current voltage input terminal is to be turned to the selected state.

3. The display device according to claim 1, wherein the direct current voltage input terminal is provided so that the scanning signal line drive circuit is given the direct current voltage from a vertical scanning end side.

4. The display device according to claim 3, wherein the direct current voltage generation circuit gradually decreases the voltage level of the direct current voltage in each frame period.

5. The display device according to claim 3, wherein the direct current voltage generation circuit decreases the voltage level of the direct current voltage step by step in each frame period so that a voltage level of the direct current voltage when a scanning signal line whose order of vertical scanning is M-th (M is an integer not less than 2 and not more than a number of the plurality of scanning signal lines) is to be turned to the selected state is not more than a voltage level of the direct current voltage when a scanning signal line whose order of vertical scanning is (M−1)-th is to be turned to the selected state.

6. The display device according to claim 1, wherein the display panel includes, as the direct current voltage input terminal, a first direct current voltage input terminal configured to give the direct current voltage to the scanning signal line drive circuit from a vertical scanning start side, and a second direct current voltage input terminal configured to give the direct current voltage to the scanning signal line drive circuit from a vertical scanning end side.

7. The display device according to claim 6, wherein, in each frame period, the direct current voltage generation circuit gradually decreases the voltage level of the direct current voltage after gradually raising the voltage level of the direct current voltage.

8. The display device according to claim 1, wherein a frequency of the voltage level of the direct current voltage is equal to a frame frequency.

9. The display device according to claim 1, wherein the direct current voltage generation circuit changes an amount of change in the voltage level of the direct current voltage in each frame period depending on an accumulated operation time of the display panel.

10. The display device according to claim 1, wherein a period corresponding to a pulse with of the plurality of clock signals is longer than one horizontal scanning period.

11. The display device according to claim 1, wherein channel layers of the first output control transistor and the second output control transistor are formed by using an oxide semiconductor.

12. A method for driving a display device including a display panel having: a plurality of scanning signal lines each being connected to a plurality of pixel formation portions; and a scanning signal line drive circuit configured to perform vertical scanning by sequentially turning the plurality of scanning signal lines to a selected state in each frame period, the method comprising:

a scanning signal line driving step of causing the scanning signal line drive circuit to sequentially turn the plurality of scanning signal lines to a selected state; and a direct current voltage generation step of generating a direct current voltage for turning the scanning signal lines to the selected state, wherein the display panel includes a direct current voltage input terminal configured to receive the direct current voltage generated in the direct current voltage generation step, the scanning signal line drive circuit includes a shift register composed of a plurality of unit circuits provided to correspond to the plurality of scanning signal lines, the shift register being configured to perform a shift operation based on a plurality of clock signals, each unit circuit includes:

a first output node configured to output a scanning signal to a corresponding scanning signal line;

a second output node configured to output a control signal for controlling operations of another unit circuit;

a first node configured to change from an OFF level to an ON level based on a control signal outputted from second output node of another unit circuit;

a first output control transistor including a control terminal connected to the first node, a first conductive terminal connected to the direct current voltage input terminal, and a second conductive terminal connected to the first output node;

a second output control transistor including a control terminal connected to the first node, a first conductive terminal given a corresponding clock signal, and a second conductive terminal connected to the second output node;

a second node configured to change from an OFF level to an ON level based on a corresponding clock signal;

a second node turn-off transistor including a control terminal connected to the first node a first conductive terminal connected to the second node and a second conductive terminal given a potential of the OFF level;

a first first-output-node turn-off transistor including a control terminal connected to the second node, a first conductive terminal connected to the first output node, and a second conductive terminal given a potential of turning a scanning signal line to a non-selected state; and a second first-output-node turn-off transistor including a control terminal connected to a second output node of an another unit circuit, a first conductive terminal connected to the first output node, and a second conductive terminal given a potential of turning a scanning signal line to a non-selected state, the voltage level of the direct current voltage generated in the direct current voltage generation step changes in each frame period, the potential given to the second conductive terminal of the first first-output-node turn-off transistor and the potential given to the second conductive terminal of the second first-output-node turn-off transistor are different from each other, the first first-output-node turn-off transistor and the second first-output-node turn-off transistor are n-channel transistors, and the potential given to the second conductive terminal of the second first-output-node turn-off transistor is lower than the potential given to the second conductive terminal of the first first-output-node turn-off transistor.

\* \* \* \* \*